United States Patent
Feng et al.

(10) Patent No.: US 7,157,938 B2
(45) Date of Patent: *Jan. 2, 2007

(54) TILEABLE FIELD-PROGRAMMABLE GATE ARRAY ARCHITECTURE

(75) Inventors: Sheng Feng, Cupertino, CA (US); Jung-Cheun Lien, San Jose, CA (US); Eddy C. Huang, San Jose, CA (US); Chung-Yuan Sun, San Jose, CA (US); Tong Liu, San Jose, CA (US); Naihui Liao, Taipei (TW); Weidong Xiong, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/335,396

(22) Filed: Jan. 18, 2006

(65) Prior Publication Data

US 2006/0114024 A1    Jun. 1, 2006

Related U.S. Application Data

(63) Continuation of application No. 11/056,957, filed on Feb. 11, 2005, now Pat. No. 7,015,719, which is a continuation of application No. 10/429,002, filed on Apr. 30, 2003, now Pat. No. 6,888,375, which is a continuation of application No. 10/066,398, filed on Jan. 30, 2002, now Pat. No. 6,700,404, which is a continuation-in-part of application No. 09/654,240, filed on Sep. 2, 2000, now Pat. No. 6,476,636.

(51) Int. Cl.
*H03K 19/177* (2006.01)

(52) U.S. Cl. .............................. 326/41; 326/39; 326/38

(58) Field of Classification Search ................... 326/41
See application file for complete search history.

(56) References Cited

U.S. PATENT DOCUMENTS 5,469,003 A    11/1995   Kean ........................... 326/39

(Continued)

FOREIGN PATENT DOCUMENTS

EP           0 415 542 A2    3/1991

(Continued)

OTHER PUBLICATIONS

"Welcome to VariCore's website", [Internet] http://www.actel.com/varicore/index3.html first visited in Feb. 2001, printed Jul. 3, 2003, Actel Corp., 1 page.

(Continued)

*Primary Examiner*—Vibol Tan
(74) *Attorney, Agent, or Firm*—Sierra Patent Group, Ltd.

(57) ABSTRACT

An apparatus includes an FPGA, which includes a first FPGA tile including a plurality of FGs, a first, second, and third set of routing conductors, and a plurality of IGs. The FGs are arranged in rows and columns with each FG being configured to receive tertiary and regular input signals, perform a logic operation, and generate regular output signals. The third set of routing conductors is coupled to the first set of output ports of the FGs and configured to receive signals, route signals within the FPGA tile, and provide input signals to the third set of input ports of the FGs. The IGs surround the FGs such that one IG is positioned at each end of each row and column. Each IG is coupled to the third set of routing conductors and configured to transfer signals from the third set of routing conductors to outside the first FPGA tile.

3 Claims, 26 Drawing Sheets

U.S. PATENT DOCUMENTS

| | | | | |
|---|---|---|---|---|
| 5,483,178 | A | 1/1996 | Costello et al. | 326/41 |
| 5,485,103 | A | 1/1996 | Pedersen et al. | 326/41 |
| 5,491,353 | A | 2/1996 | Kean | 257/208 |
| 5,504,439 | A | 4/1996 | Tavana | 326/38 |
| 5,521,529 | A | 5/1996 | Agrawal et al. | 326/41 |
| 5,528,176 | A | 6/1996 | Kean | 326/105 |
| 5,537,057 | A | 7/1996 | Leong et al. | 326/41 |
| 5,541,530 | A | 7/1996 | Cliff et al. | 326/41 |
| 5,570,041 | A | 10/1996 | El-Avat et al. | 326/41 |
| 5,598,109 | A | 1/1997 | Leong et al. | 326/41 |
| 5,606,266 | A | 2/1997 | Pedersen | 326/41 |
| 5,606,267 | A | 2/1997 | El Ayat et al. | 326/41 |
| 5,614,840 | A | 3/1997 | McClintock et al. | 326/41 |
| 5,617,042 | A | 4/1997 | Agrawal | 326/39 |
| 5,621,650 | A | 4/1997 | Agrawal et al. | 364/489 |
| 5,644,496 | A | 7/1997 | Agrawal et al. | 364/489 |
| 5,668,771 | A | 9/1997 | Cliff et al. | 365/230.03 |
| 5,671,432 | A | 9/1997 | Bertolet et al. | 395/800 |
| 5,682,107 | A | 10/1997 | Tavana et al. | 326/41 |
| 5,689,195 | A | 11/1997 | Cliff et al. | 326/41 |
| 5,761,099 | A | 6/1998 | Pedersen | 364/716.01 |
| 5,764,583 | A | 6/1998 | Cliff et al. | 365/230.03 |
| 5,809,281 | A | 9/1998 | Steele et al. | 395/497.01 |
| 5,815,003 | A | 9/1998 | Pedersen | 326/39 |
| 5,825,202 | A | 10/1998 | Tavana et al. | 326/39 |
| 5,828,229 | A | 10/1998 | Cliff et al. | 326/40 |
| 5,874,834 | A | 2/1999 | New | 326/39 |
| 5,878,051 | A | 3/1999 | Sharma et al. | 371/22.1 |
| 5,880,598 | A | 3/1999 | Duong | 326/41 |
| 5,977,793 | A | 11/1999 | Reddy et al. | 326/41 |
| 5,990,702 | A | 11/1999 | Agrawal et al. | 326/41 |
| 6,020,755 | A | 2/2000 | Andrews et al. | 326/39 |
| 6,034,544 | A | 3/2000 | Agrawal et al. | 326/39 |
| 6,064,225 | A | 5/2000 | Andrews et al. | 326/41 |
| 6,084,427 | A | 7/2000 | Lee et al. | 326/39 |
| 6,084,429 | A | 7/2000 | Trimberger | 326/41 |
| 6,091,263 | A | 7/2000 | New et al. | 326/40 |
| 6,108,806 | A | 8/2000 | Abramovici et al. | 714/725 |
| 6,181,162 | B1 | 1/2001 | Lytle et al. | 326/41 |
| 6,211,697 | B1 | 4/2001 | Lien et al. | 326/41 |
| 6,301,696 | B1 | 10/2001 | Lien et al. | 716/16 |
| 6,446,242 | B1 | 9/2002 | Lien et al. | 716/6 |
| 6,463,560 | B1 | 10/2002 | Bhawmik et al. | 714/733 |
| 6,476,636 | B1 | 11/2002 | Lien et al. | 326/41 |
| 6,550,030 | B1 | 4/2003 | Abramovici et al. | 714/725 |
| 6,611,153 | B1 * | 8/2003 | Lien et al. | 326/41 |
| 6,631,487 | B1 | 10/2003 | Abramovici et al. | 714/725 |
| 6,651,238 | B1 | 11/2003 | Wells et al. | 716/16 |
| 6,681,354 | B1 | 1/2004 | Gupta | 714/725 |
| 6,700,404 | B1 | 3/2004 | Feng et al. | 326/41 |
| 6,725,442 | B1 | 4/2004 | Cote et al. | 716/16 |
| 6,774,670 | B1 * | 8/2004 | Feng et al. | 326/41 |
| 6,800,884 | B1 * | 10/2004 | Feng et al. | 257/209 |
| 6,870,396 | B1 | 3/2005 | Lien et al. | 326/41 |

FOREIGN PATENT DOCUMENTS

| | | |
|---|---|---|
| EP | 0 415 542 A3 | 3/1991 |
| GB | 2 346 240 A | 8/2000 |

OTHER PUBLICATIONS

"Overview", [Internet] http://actel.com/varicore/about.index.html, first visited in Feb. 2001, printed Jul. 3, 2003, Actel Corp., 3 pages.

"Products-VariCore", [Internet] http://actel.com/varicore/products/index.html, first visited in Feb. 2001, printed Jul. 3, 2003, Actel Corp., 2 pages.

"Documentation", [Internet] http://actel.com/varicore/support/index.html first visited in Feb. 2001, printed Jul. 3, 2003, Actel Corp., 1 page.

"Design Alliance", [Internet] http://actel.com/varicore/alliances/index.html, first visited in Feb. 2001, printed Jul. 3, 2003, Actel Corp., 1 page.

"Press Releases", [Internet] http://actel.com/varicore/press/index.html, first visited in Feb. 2001, printed Jul. 3, 2003, Actel Corp., 1 page.

"Contact Info", [Internet] http://actel.com/varicore/contact/index.html, first visited in Feb. 2001, printed Jul. 3, 2003, Actel Corp., 1 page.

"Market & General FAQ", [Internet] http://actel.com/varicore/about/FAQs.html, first visited in Feb. 2001, printed Jul. 3, 2003, Actel Corp. 3 pages.

Bryant, I et al., "The Actel Embeddable FPGA Core", Internet published at http://www.actel.com/varicore/support//index.html first visited in Feb. 2001, printed Jul. 5, 2003.

Gibson, G. et al., "Boundary Scan Access of Built-In Self-Test for Field Programmable Gate Arrays", ASIC Conference and Exhibit Proceedings Tenth Annual IEEE International, Portland, Oregon, USA, pp. 57-61, Sep. 7-10, 1997.

Krupnova, H., "Iterative Improvement Based Multi-Way Netlist Partitioning for FPGAs", Design, Automation and Test in Europe Conference and Exhibition Proceedings, Munich, Germany, pp. 587-594, Mar. 9-12, 1999.

Hamilton, C., "Methods for Boundary Scan Access of Built-In Self-Test for Field Programmable Gate Arrays", Southeastern Proceedings IEEE, Lexington, Kentucky, USA, pp. 210-216, Mar. 25-28, 1999.

Xu, M. et al., "Layout-Driven High Level Synthesis for FPGA Based Architectures", Design, Automation and Test in Europe Proceedings, Paris, France, pp. 446-450, Feb. 23-26, 1998.

* cited by examiner

TILEABLE FIELD-PROGRAMMABLE GATE ARRAY ARCHITECTURE

CROSS-REFERENCE TO RELATED APPLICATIONS

This application is a continuation of U.S. patent application Ser. No. 11/056,957, filed Feb. 11, 2005, now issued as U.S. Pat. No. 7,015,719, which is a continuation of U.S. patent application Ser. No. 10/429,002, filed Apr. 30, 2003, now issued as U.S. Pat. No. 6,888,375, which is a continuation of U.S. patent application Ser. No. 10/066,398, filed Jan. 30, 2002, now issued as U.S. Pat. No. 6,700,404, which is a continuation-in-part of U.S. patent application Ser. No. 09/654,240, filed Sep. 2, 2000, now issued as U.S. Pat. No. 6,476,636, which are hereby incorporated by reference as if set forth herein.

BACKGROUND OF THE INVENTION

1. Field of the Invention

The present invention relates to field-programmable gate arrays, and more particularly, to architecture for tileable field-programmable gate arrays.

2. Description of the Related Art

A field-programmable gate array (FPGA) is an integrated circuit (IC) that includes a two-dimensional array of general-purpose logic circuits, called cells or logic blocks, whose functions are programmable. The cells are linked to one another by programmable buses. The cell types may be small multifunction circuits (or configurable functional blocks or groups) capable of realizing all Boolean functions of a few variables. The cell types are not restricted to gates. For example, configurable functional groups typically include memory cells and connection transistors that may be used to configure logic functions such as addition, subtraction, etc., inside of the FPGA. A cell may also contain one or two flip-flops. Two types of logic cells found in FPGAs are those based on multiplexers and those based on programmable read only memory (PROM) table-lookup memories. Erasable FPGAs can be reprogrammed many times. This technology is especially convenient when developing and debugging a prototype design for a new product and for small-scale manufacture.

FPGAs typically include a physical template that includes an array of circuits, sets of uncommitted routing interconnects, and sets of user programmable switches associated with both the circuits and the routing interconnects. When these switches are properly programmed (set to on or off states), the template or the underlying circuit and interconnect of the FPGA is customized or configured to perform specific customized functions. By reprogramming the on-off states of these switches, an FPGA can perform many different functions. Once a specific configuration of an FPGA has been decided upon, it can be configured to perform that one specific function.

The user programmable switches in an FPGA can be implemented in various technologies, such as ONO antifuse, M—M antifuse, SRAM memory cell, Flash EPROM memory cell, and EEPROM memory cell. FPGAs that employ fuses or antifuses as switches can be programmed only once. A memory cell controlled switch implementation of an FPGA can be reprogrammed repeatedly. In this scenario, an NMOS transistor is typically used as the switch to either connect or disconnect two selected points (A, B) in the circuit. The NMOS' source and drain nodes are connected to points A, B respectively, and its gate node is directly or indirectly connected to the memory cell. By setting the state of the memory cell to either logical "1" or "0", the switch can be turned on or off and thus point A and B are either connected or disconnected. Thus, the ability to program these switches provides for a very flexible device.

FPGAs can store the program that determines the circuit to be implemented in a RAM or PROM on the FPGA chip. The pattern of the data in this configuration memory CM determines the cells' functions and their interconnection wiring. Each bit of CM controls a transistor switch in the target circuit that can select some cell function or make (or break) some connection. By replacing the contents of CM, designers can make design changes or correct design errors. The CM can be downloaded from an external source or stored on-chip. This type of FPGA can be reprogrammed repeatedly, which significantly reduces development and manufacturing costs.

In general, an FPGA is one type of programmable logic device (PLD), i.e., a device that contains many gates or other general-purpose cells whose interconnections can be configured or "programmed" to implement any desired combinational or sequential function. As its name implies, an FPGA is "field-programmable", meaning that the device is generally programmed by designers or end users "in the field" via small, low-cost programming units. This is in contrast to mask programmable devices which require special steps in the IC chip-manufacturing process.

A field-programming unit typically uses design software to program the FPGA. The design software compiles a specific user design, i.e., a specific configuration of the programmable switches desired by the end-user, into FPGA configuration data. The design software assembles the configuration data into a bit stream, i.e., a stream of ones and zeros, that is fed into the FPGA and used to program the configuration memories for the programmable switches. The bit stream creates the pattern of the data in the configuration memory CM that determines whether each memory cell stores a "1" or a "0". The stored bit in each CM controls whether its associated transistor switch is turned on or off. End users typically use design software to test different designs and run simulations for FPGAs.

When an FPGA that has been programmed to perform one specific function is compared to an application specific integrated circuit (ASIC) that has been designed and manufactured to perform that same specific function, the FPGA will necessarily be a larger device than the ASIC. This is because FPGAs are very flexible devices that are capable of implementing many different functions, and as such, they include a large amount of excess circuitry that is either not used or could be replaced with hard-wired connections when performing one specific function. Such excess circuitry generally includes the numerous programmable transistor switches and corresponding memory cells that are not used in implementing the one specific function, the memory cells inside of functional groups, and the FPGA programming circuitry. This excess circuitry is typically eliminated in the design of an ASIC, which makes the ASIC a smaller device. An ASIC, on the other hand, is not a flexible device. In other words, once an ASIC has been designed and manufactured it cannot be reconfigured to perform a different function like is possible with an FPGA.

Designers of FPGAs (as well as other PLDs) often provide their circuit designs to IC manufacturers who typically manufacture the FPGAs in two different ways. First, an FPGA design may be manufactured as its own chip with no other devices being included in the IC package. Second, an FPGA design may be embedded into a larger IC. An example of such a larger IC is a system on a chip (SOC) that includes the embedded FPGA as well as several other components. The several other components may include, for example, a microprocessor, memory, arithmetic logic unit (ALU), state machine, etc. In this scenario the embedded FPGA may be only a small part of the whole SOC.

Whether an FPGA is to be manufactured as its own IC or embedded into a larger IC (e.g., an SOC), the intended application/use of the IC will determine the size and complexity of the FPGA that is needed. In some scenarios a large FPGA is needed, and in other scenarios a small FPGA is needed. Because conventional FPGAs are typically designed for their intended application/use, an FPGA designed to fulfill a need for a small FPGA must be substantially redesigned for use where a larger FPGA is needed. Therefore, it would be highly advantageous to have an FPGA apparatus and method that could be easily adapted for use in both ICs requiring large FPGAs and ICs requiring small FPGAs. Furthermore, it would be highly advantageous if such FPGA apparatus and method could be used in both the scenario where the FPGA is to be manufactured as its own IC and the scenario where the FPGA is to be embedded into a larger IC.

BRIEF SUMMARY OF THE INVENTION

The present invention provides an apparatus that includes a field-programmable gate array (FPGA). The FPGA includes a first FPGA tile, and the first FPGA tile includes a plurality of functional groups (FGs), a first set of routing conductors, and a plurality of interface groups (IGs). The plurality of FGs are arranged in rows and columns with each of the FGs coupled to the first set of routing conductors to receive input signals, perform a logic operation, and generate signals through first outputs coupled to said first set of routing conductors. The first set of routing conductors is coupled to the FGs and configured to receive signals, route signals within the first FPGA tile, and provide the signals to the FGs via first input ports. The plurality of IGs surround the plurality of FGs such that one IG is positioned at each end of each row and column. Each of the IGs is coupled to the first set of routing conductors and configured to transfer signals from the first set of routing conductors to outside of the first FPGA tile.

A better understanding of the features and advantages of the present invention will be obtained by reference to the following detailed description of the invention and accompanying drawings, which set forth an illustrative embodiment in which the principles of the invention are utilized.

DETAILED DESCRIPTION OF THE INVENTION

Figure 1:
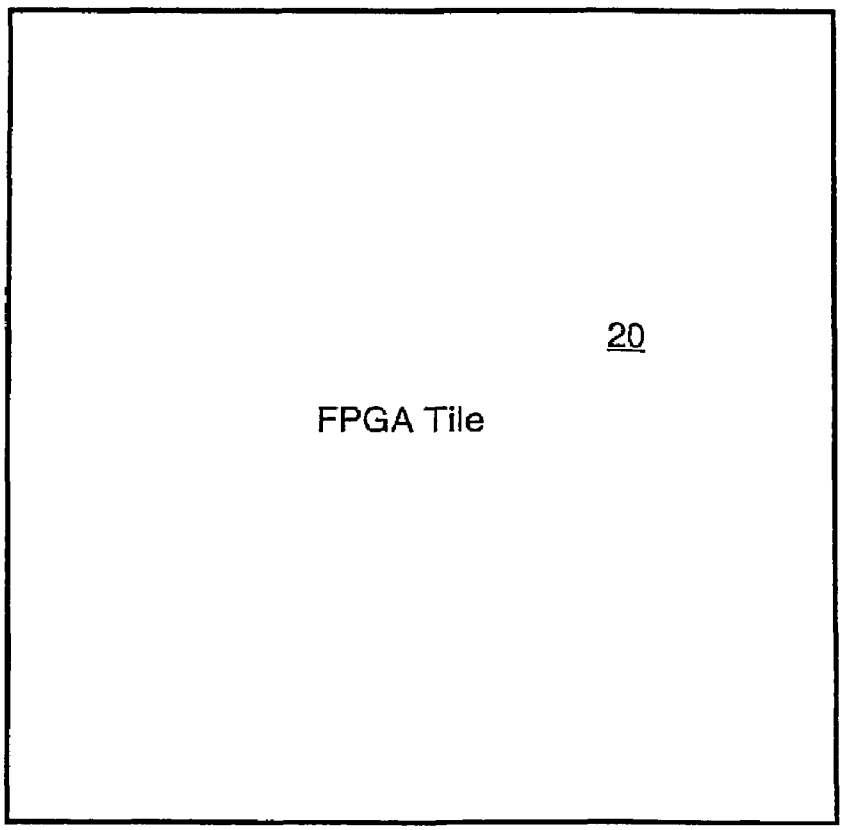
FIG. 1 is a block diagram illustrating an FPGA tile in accordance with the present invention.

Referring to FIG. 1, there is illustrated a field-programmable gate array (FPGA) tile 20 in accordance with the present invention. The FPGA tile 20 overcomes many of the disadvantages of conventional FPGAs in that it can be easily adapted for use in both integrated circuits (ICs) requiring large FPGAs and ICs requiring small FPGAs. Furthermore, the FPGA tile 20 can be used where the FPGA is to be manufactured as its own IC and where the FPGA is to be embedded into a larger IC (e.g., a system on a chip (SOC)).

Figure 2:
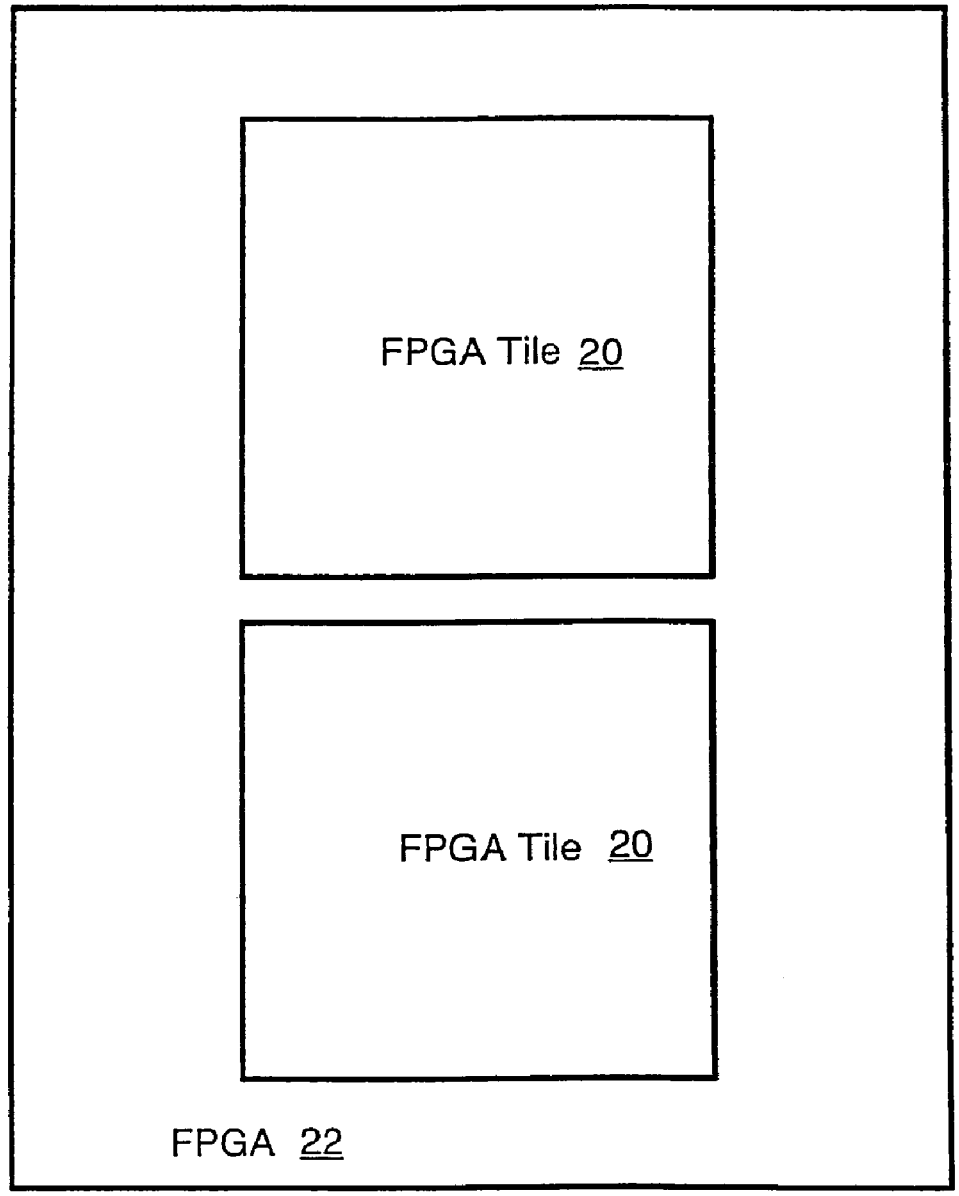
FIGS. 2, 3A, 3B and 4 are block diagrams illustrating various configurations of FPGA tiles in accordance with the present invention.
Figure 3A:
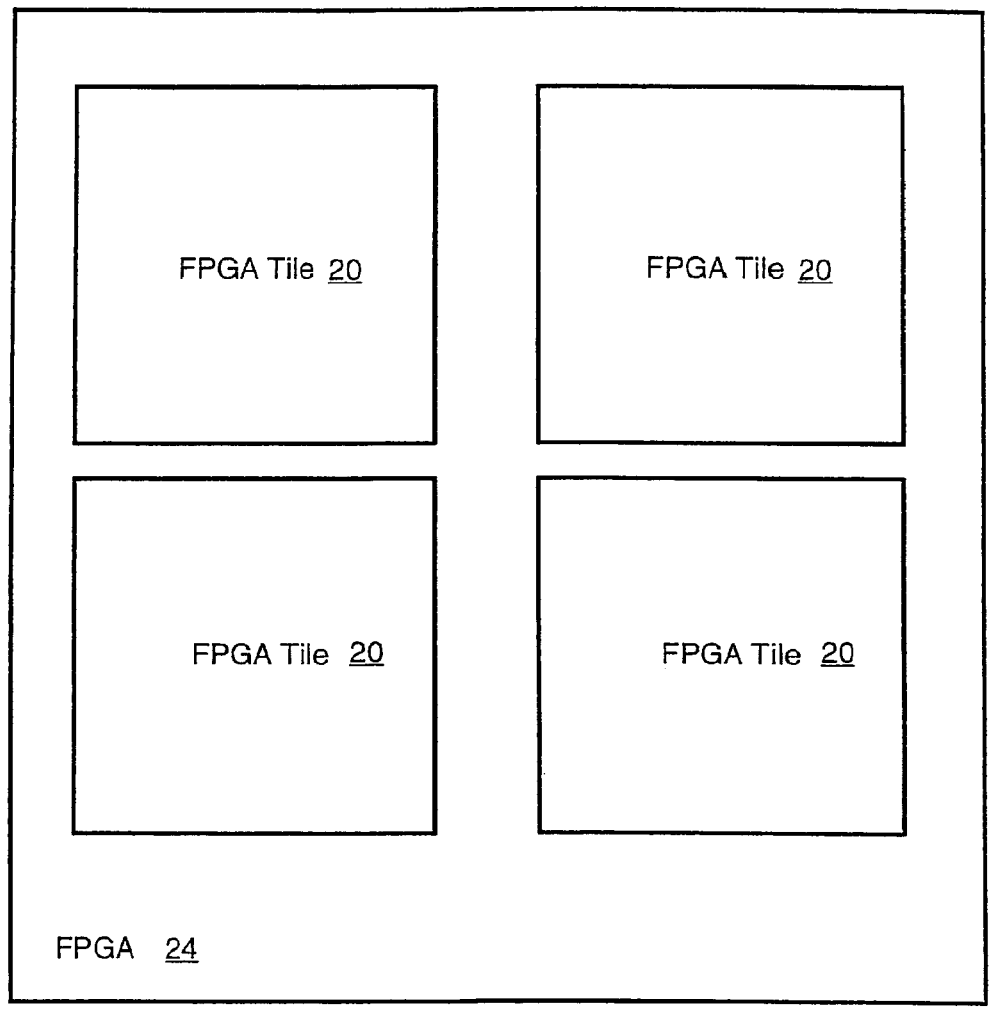

One feature of the FPGA tile 20 that makes it such a flexible and adaptable device is that it is "tileable". As used herein, the term "tileable" means that the FPGA tile 20 can be combined with other FPGA tiles to form a larger FPGA. For example, FIG. 2 illustrates an FPGA 22 that is formed by combining two FPGA tiles 20. The two FPGA tiles 20 work together and communicate with each other to form the larger FPGA 22. It should be well understood that any number of FPGA tiles 20 may be combined in accordance with the present invention to form a larger FPGA. For example, FIG. 3A illustrates an FPGA 24 that is formed by combining four FPGA tiles 20.

Figure 3B:
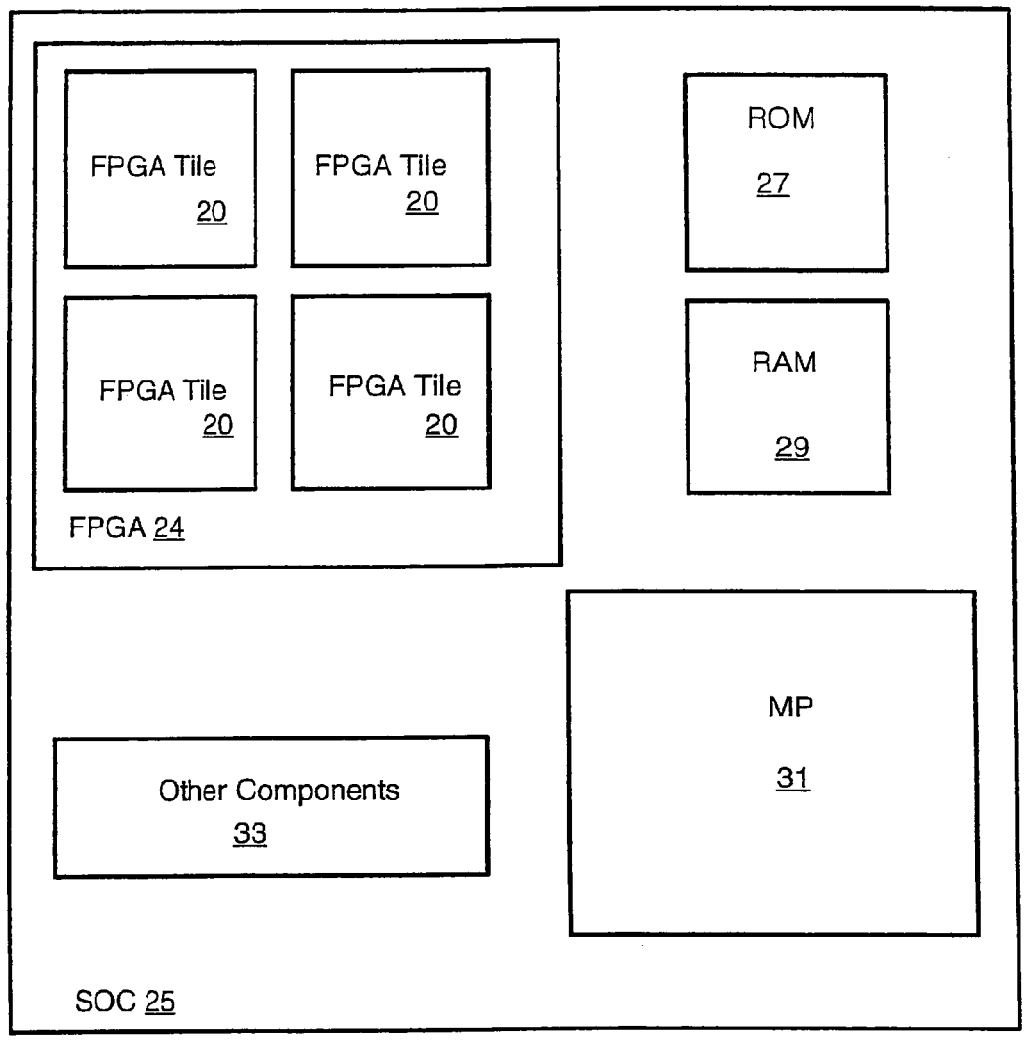
Figure 4:
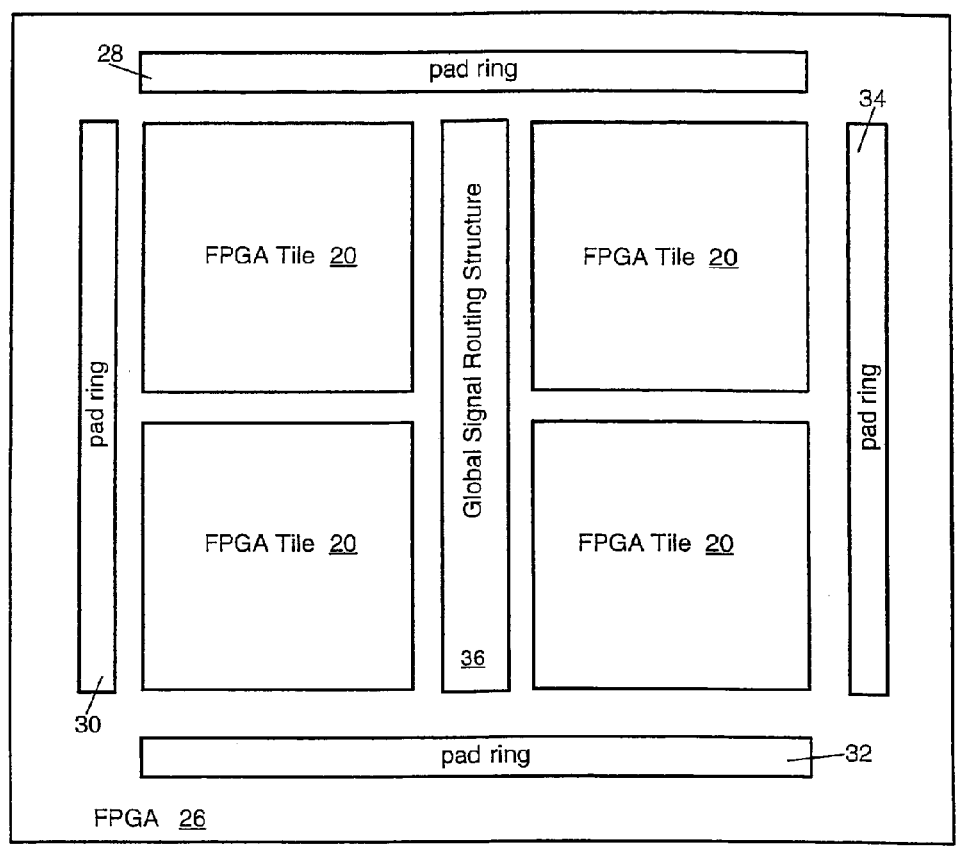

In accordance with the present invention, FPGA tiles 20 may be combined to form a larger FPGA that is to be manufactured as its own IC or that is to be embedded into a larger IC. For example, with respect to the later scenario, the FPGAs 22, 24 may be embedded into SOCs. FIG. 3B shows an SOC 25 having the FPGA 24 embedded therein. The SOC 25 includes several other components. The other components may include, for example, a read only memory (ROM) 27, a random access memory (RAM) 29, a microprocessor 31, and any other components 33. It should be well understood that the specific types of other components and the number of other components included on the SOC 25 will vary greatly depending on the particular application. With respect to the former scenario, FIG. 4 illustrates an FPGA 26 that has been manufactured as its own IC. Specifically, the FPGA 26 includes four FPGA tiles 20 and four pad rings 28, 30, 32, 34. The pad rings 28, 30, 32, 34 are used to couple the FPGA tiles 20 to the IC package pins of the FPGA 26.

Also illustrated in FIG. 4 is a global routing structure 36. The global routing structure 36 will be described in more detail below, but in general, it is a routing structure used to route inter-tile global signals between the FPGA tiles 20. It should be understood that the global routing structure 36 may be included in any combination of FPGA tiles 20, including for example the FPGAs 22, 24, in accordance with the present invention. Furthermore, the global routing structure 36 may be used whether the combined FPGA tiles 20 are manufactured as their own IC or embedded into a larger IC.

The FPGA tiles that are combined may be identical (as are the tiles in the FPGAs 22, 24, 26), or of different sizes and designs in accordance with the present invention. An advantage of using identical FPGA tiles is that it provides an economical solution for providing FPGAs having sizes that are appropriate for the intended uses/applications. Such a solution is economical because only one FPGA tile needs to be designed, and then the necessary number of tiles are combined to form an FPGA. Additionally, it should be understood that an "FPGA tile" is considered herein to be an FPGA. In other words, a single FPGA tile 20 can be used by itself to form an FPGA.

Figure 5:
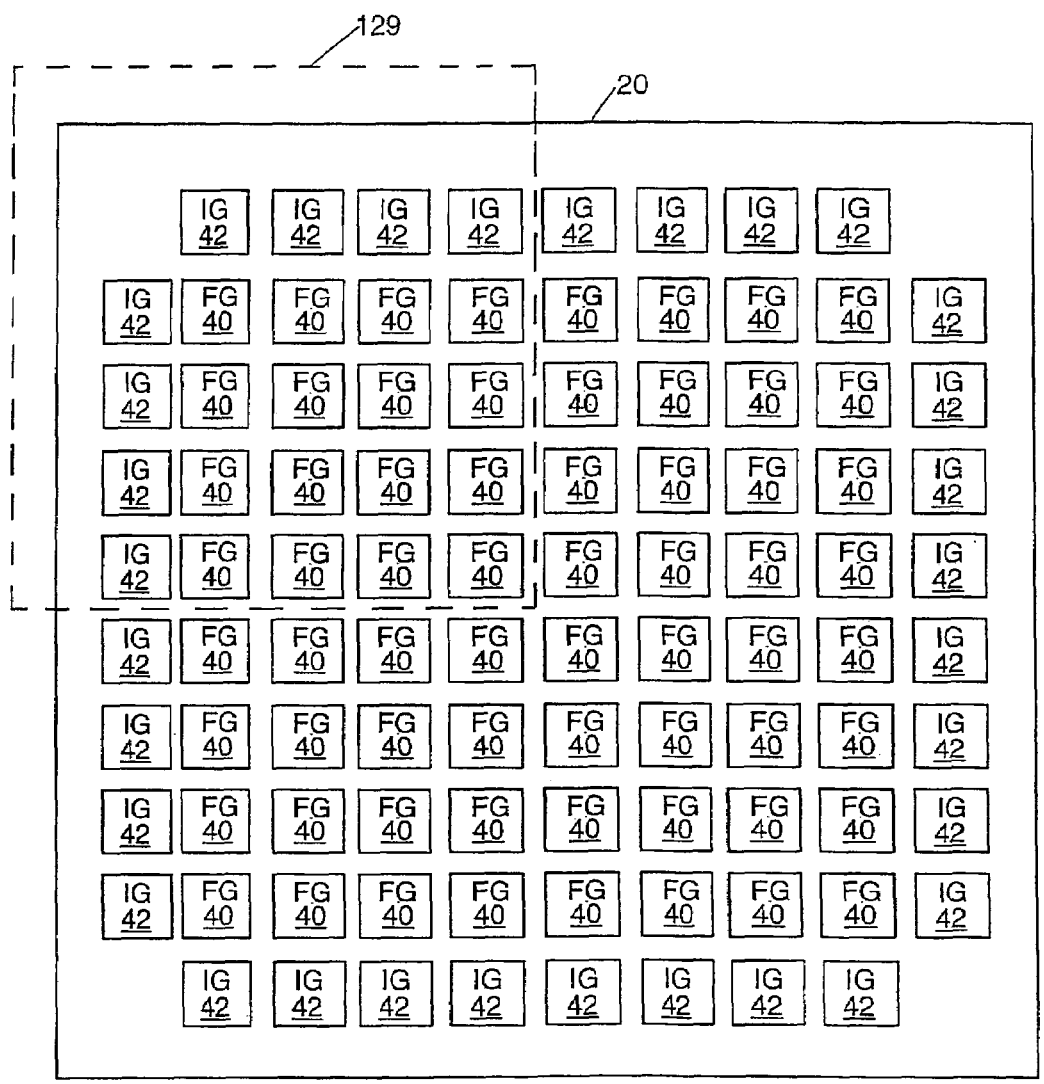
FIG. 5 is a block diagram illustrating in further detail the FPGA tile shown in FIG. 1.

Referring to FIG. 5, there is illustrated some of the internal components of the FPGA tile 20. Specifically, the FPGA tile 20 includes several functional groups (FGs) 40 that are surrounded by several interface groups (IGs) 42. The FGs 40 are small multifunction circuits that are capable of realizing many or all Boolean functions. The FGs 40 include look-up tables (LUTs) and other circuits capable of realizing Boolean functions, as well as memory cells that are used to configure logic functions such as addition, subtraction, etc. The IGs 42 are used for interfacing the FPGA tile 20 to other FPGA tiles or devices, or to pad rings for connecting the FPGA tile 20 to IC package pins. In general, the logic structure of the FPGA tile 20 is provided by the FGs 40 and the IGs 42. Also included in the FPGA tile 20, but not shown in FIG. 5, are several horizontal and vertical regular routing buses, routing interconnect areas, switching transistors, and global routing structure, all of which will be discussed below.

Figure 6:
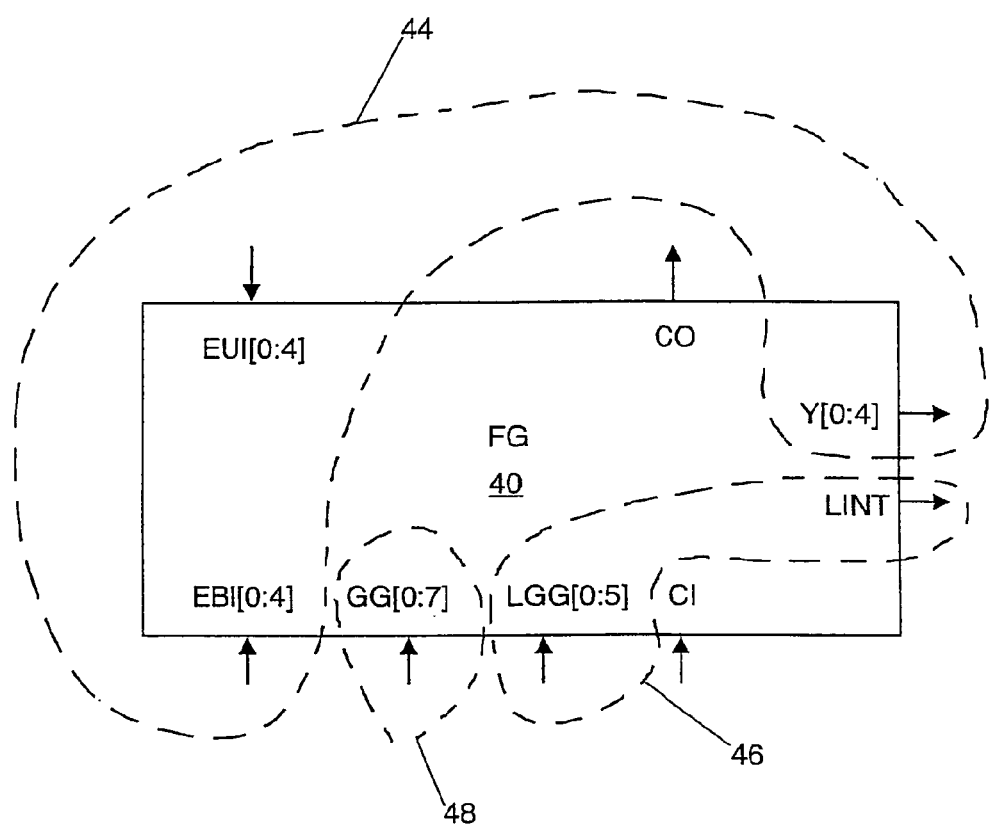
FIG. 6 is a block diagram illustrating in further detail one of the functional groups (FGs) shown in FIG. 5.

Referring to FIG. 6, an exemplary version of the FG 40 includes first set of input and output ports 44, intra-tile global input and output ports 46, and inter-tile global input port 48. The first set of input and output ports carry input signals EUI[0:4] (upper input) and EBI[0:4] (bottom input). These inputs are the basic inputs on which the Boolean functions and logic operation of the FG 40 are performed. The first set of input and output ports 44 also carry output signals Y[0:4]. These signals are the basic outputs, which carry the result of the Boolean functions and logic operation of the FG 40. The first set of input and output ports 44 route signals that are carried within the FPGA tile 20 on horizontal and vertical regular routing buses and routing interconnect areas. If any of the signals sent via first inputs and output ports 44 are to be sent to a different FPGA tile, they are passed through an IG 42 as shown in FIG. 5.

The intra-tile global input and output ports 46 carry input signals LGG[0:5] and output signal LINT. The LINT signal is carried via a second set of routing resources. Specifically, in some situations the first set of routing output signals Y[0:4] cannot be sent to the intended FG 40 because the first set of routing conductors and routing interconnect areas do not provide the necessary connections. Or, in other situations, it may be desirable not to use the system central processing unit (CPU) time to send a signal through the first set of routing conductors and routing interconnect areas. In these situations, the needed one of the regular routing output signals Y[0:4] can be selected as the LINT signal. The LINT signal is routed around the FPGA tile 20 by a routing structure that is separate from the first set of routing conductors and routing interconnect areas used to route the first set of output signals Y[0:4]. Therefore, the LINT signal can be sent to any FG 40 or IG 42 regardless of whether the first set of routing conductors and routing interconnect areas provide the necessary connections. The LINT signals are received by the FG 40 via input ports LGG[0:5] which are part of the second set of routing conductors carrying the LINT signals. As its name implies, the intra-tile global input and output ports 46 carry signals that are routed within the boundaries of the FPGA tile 20 and are preferably not routed between FPGA tiles. The intra-tile global inputs and output ports 46 and the generation and use of the LINT signal will be discussed in more detail below.

The inter-tile global input port 48 carries the input signals GG[0:7]. These signals are sent to every FG 40 in all FPGA tiles. As will be discussed below, selected ones of the input signals GG[0:7] are used to control the clock/enable/preset/clear (C/E/P/C) inputs of flip-flops included in each FG 40.

Each FG 40 also includes a CL input and a CO output. The purpose of these input and output ports is to implement a carry chain for faster utilization of logic resources.

Figure 7:
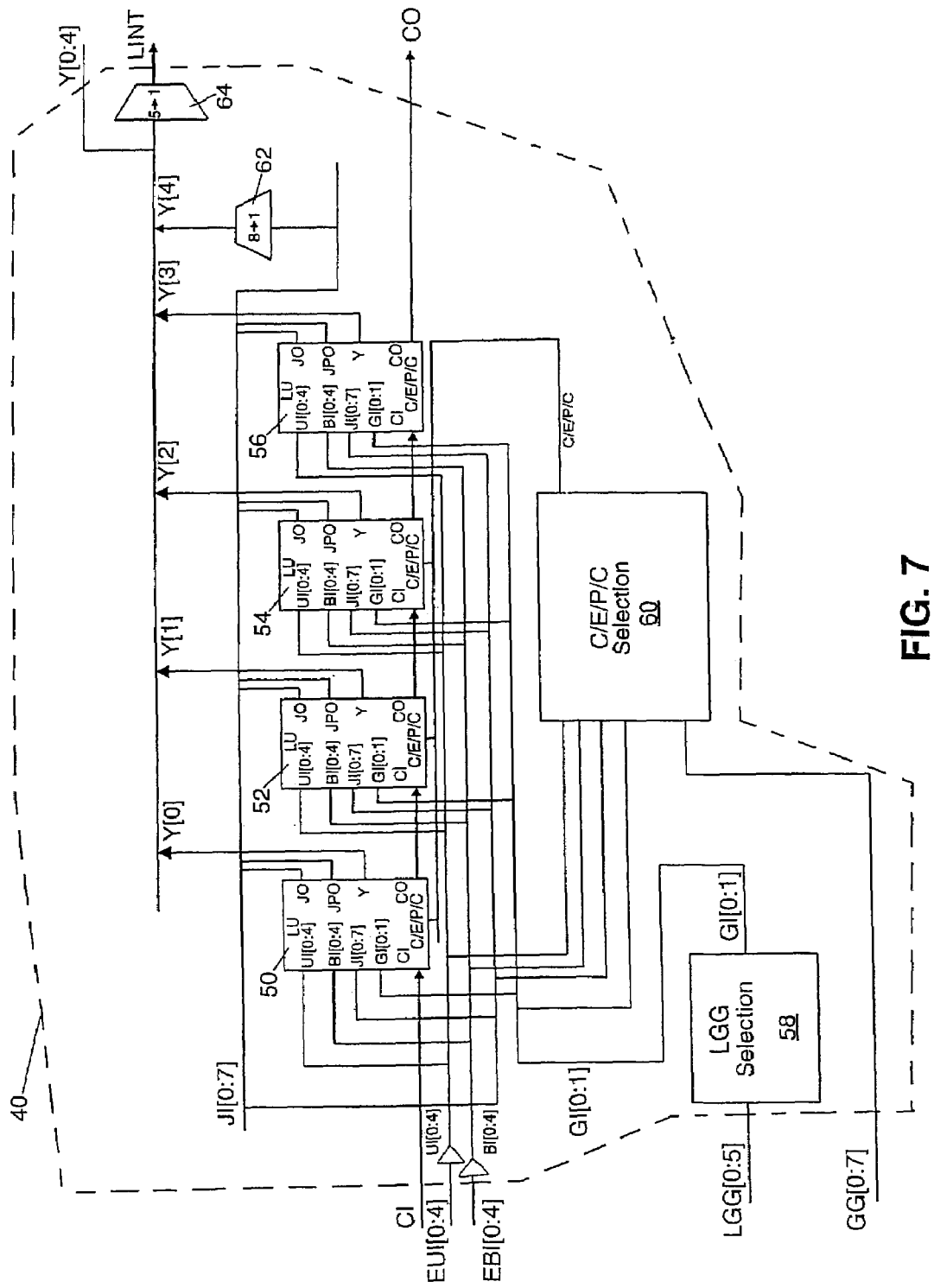
FIG. 7 is a schematic diagram illustrating in further detail the FG shown in FIG. 6.

Referring to FIG. 7, each FG 40 preferably includes four logic units (LU) 50, 52, 54, 56. The LUs 50, 52, 54, 56 provide the Boolean functions and logic operations of the FG 40. Each of the LUs 50, 52, 54, 56 includes several inputs on which Boolean functions and logic operations are performed. As shown, each of the LUs 50, 52, 54, 56 includes twenty such inputs, but it should be understood that the number of inputs may vary in accordance with the present invention. Specifically, each of the LUs 50, 52, 54, 56 receives signals through input ports UI[0:4] and BI[0:4] which correspond to signals received through regular input ports EUI[0:4] and EBI[0:4] discussed above. Furthermore, each of the LUs 50, 52, 54, 56 receives signals through input port GI[0:1]. The input signals GI[0:1] are generated by the LGG selection circuit 58 which selects two of the input signals LGG[0:5]. As mentioned above, the input port LGG[0:5] carries selected ones of the signals traveling via the LINT bus. Finally, each of the LUs 50, 52, 54, 56 receives signals via input port JI[0:7]. The input signals via input port JI[0:7] include two output signals from each of the LUs 50, 52, 54, 56. Thus, two output signals of each of the LUs 50, 52, 54, 56 are fed back to the inputs by way of JI[0:7].

Each of the LUs 50, 52, 54, 56 also includes a clock/enable/preset/clear (C/E/P/C) input. This input is used to control a flip-flop included inside each of the LUs 50, 52, 54,

56. The C/E/P/C input is generated by a C/E/P/C selection circuit 60. The C/E/P/C selection circuit 60 receives inputs EUI[0:4], EBI[0:4], JI[0:7], GI[0:1], and GG[0:7]. From these signals, the C/E/P/C selection circuit 60 selects four signals to be used as the C/E/P/C signals.

Each of the LUs 50, 52, 54, 56 includes three outputs: Y, JPO, and JO. These outputs carry the result of the Boolean functions and logic operations performed by the LU. As already mentioned, the JPO and JO outputs from each of the LUs 50, 52, 54, 56 are grouped together to form the JI[0:7] bus which is fed back into the inputs of the LUs 50, 52, 54, 56. The Y output from each of the LUs 50, 52, 54, 56 are grouped together to form Y[0:3] of the Y[0:4] bus. The Y[4] signal is selected using a multiplexer (or selection circuit) 62 to select from the JI[0:7] bus. An advantage of selecting the Y[4] signal from the JI[0:7] bus is that it adds flexibility to the device. In other words, the JO or JPO output of any of the LUs 50, 52, 54, 56 can be chosen as the Y[4] signal.

The LINT signal can be selected to be any one of the Y[0:4] signals using a multiplexer 64. The use of the LINT signal adds a tremendous amount of flexibility to the FPGA tile 20 because the LINT signal can be sent to any of the FGs 40 or IGs 42. This is because the LINT signal is routed around the FPGA tile 20 using a routing structure that is separate and independent from that of the Y[0:4] bus. In those situations where one of the signals on the Y[0:4] bus cannot be sent to the desired destination or CPU time needs to be conserved, the multiplexer 64 can be used to select that one of the Y[0:4] signals as the LINT signal in order to send the signal to the desired destination.

Figure 8:
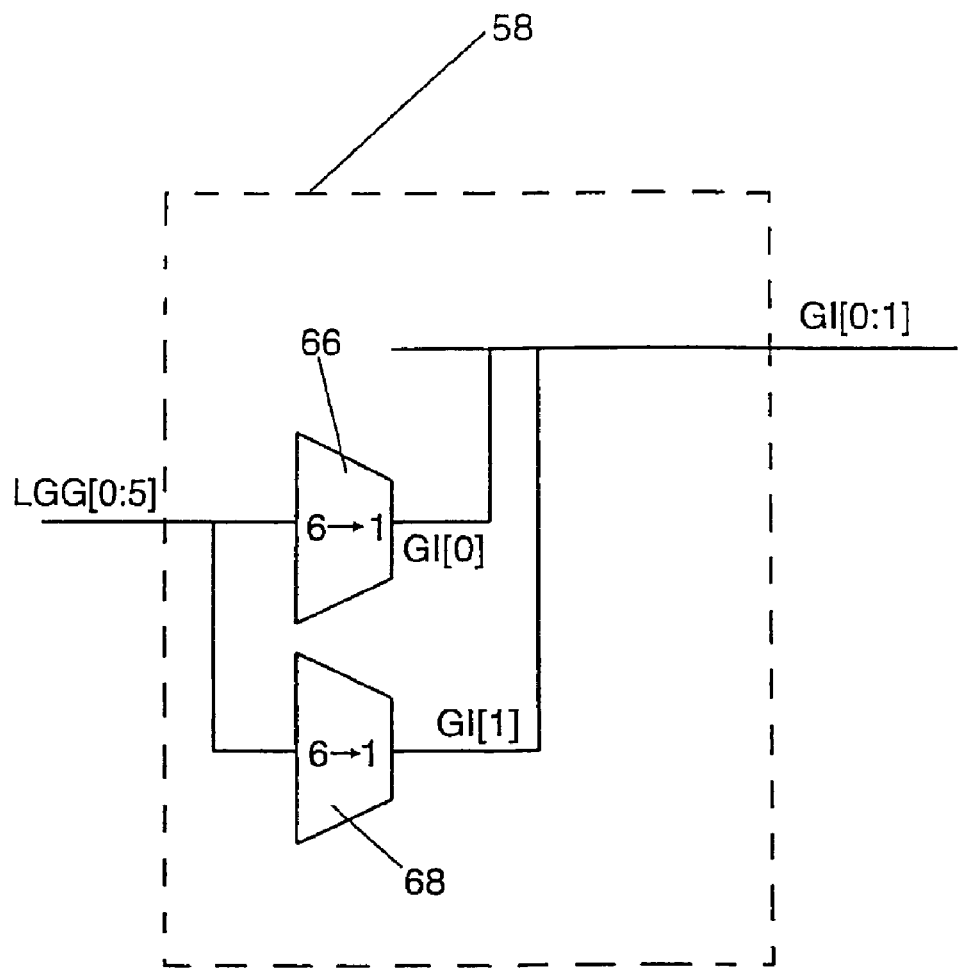
FIG. 8 is a schematic diagram illustrating in further detail the LGG selection circuit shown in FIG. 7.

Referring to FIG. 8, one exemplary version of the LGG selection circuit 58 includes two six-to-one multiplexers 66, 68. Each multiplexer 66, 68 selects one of the input signals LGG[0:5]. The signal selected by multiplexer 66 becomes the signal GI[0], and the signal selected by multiplexer 68 becomes the signal GI[1]. Because the LGG[0:5] bus is supplied to both multiplexers 66, 68, it is possible for the signals GI[0] and GI[1] to be the same signal. As mentioned above, the LGG[0:5] bus is a way for LINT signals from any FG 40 or IG 42 to be sent to any FG 40 or IG 42. The exemplary version of the LGG selection circuit 58 shown can select any two of these LINT signals for sending to the LUs 50, 52, 54, 56 via the GI[0:1] bus. It should be understood, however, that various different designs of the LGG selection circuit 58 may be used to select various different numbers of signals from the LGG[0:5] bus for the LUs 50, 52, 54, 56 in accordance with the present invention.

Figure 9:
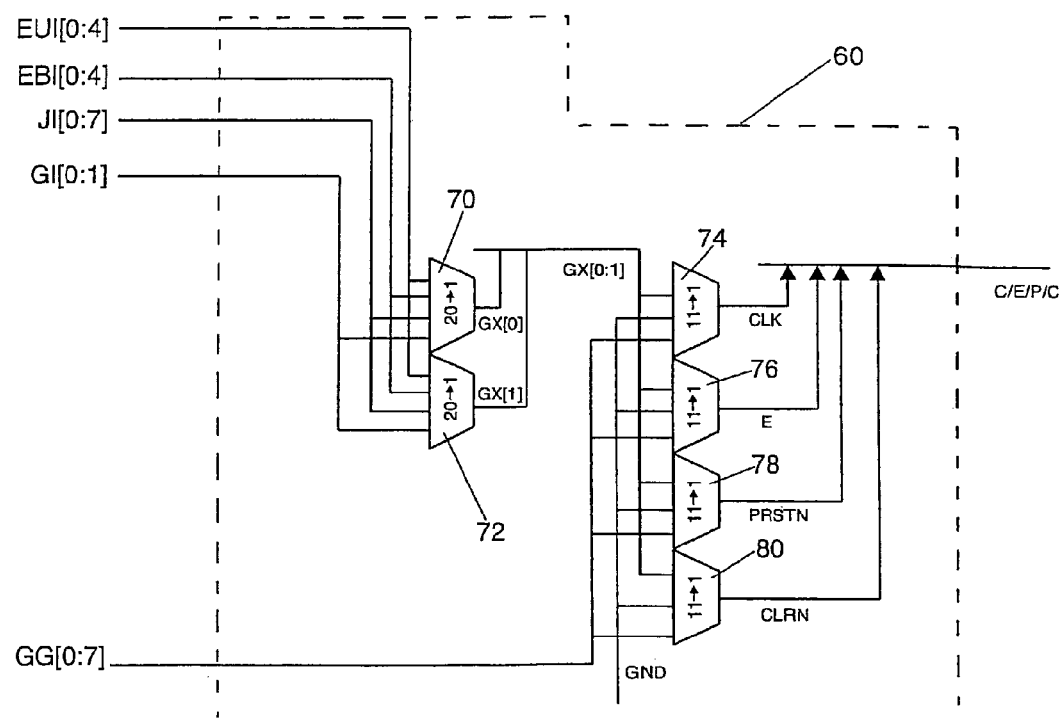
FIG. 9 is a schematic diagram illustrating in further detail the C/E/P/C selection circuit shown in FIG. 7.

Referring to FIG. 9, there is illustrated an exemplary version of the C/E/P/C selection circuit 60. The circuit 60 includes two twenty-to-one multiplexers 70, 72. Each multiplexer 70, 72 selects one signal from the buses EUI[0:4], EBI[0:4], JI[0:7], and GI[0:1]. The signal selected by multiplexer 70 becomes the signal GX[0], and the signal selected by multiplexer 72 becomes the signal GX[1]. The bus GX[0:1] is supplied to the inputs of four eleven-to-one multiplexers 74, 76, 78, 80. Also supplied to the inputs of the four multiplexers 74, 76, 78, 80 are the GG[0:7] bus and a ground signal bus. The signal selected by multiplexer 74 becomes the clock signal CLK, the signal selected by multiplexer 76 becomes the enable signal E, the signal selected by multiplexer 78 becomes the preset signal PRSTN, and the signal selected by multiplexer 80 becomes the clear signal CLRN. The use of the four multiplexers 74, 76, 78, 80 allows any of the signals GX[0:1], GG[0:7], and ground to be selected as one of the C/E/P/C signals.

As discussed above, the GG[0:7] bus is an inter-tile global bus that is sent to every FG 40 in all FPGA tiles. The signals in the GG[0:7] bus are often selected as the C/E/P/C signals. In addition, the C/E/P/C selection circuit 60 advantageously allows the two signals GX[0:1] to be selected as the C/E/P/C signals. And the two signals GX[0:1] can be selected from any of the buses EUI[0:4], EBI[0:4], JI[0:7], and GI[0:1]. Therefore, the C/E/P/C selection circuit 60 allows numerous different signals to be selected as the C/E/P/C signals, which provides for a very flexible device. It should be well understood, however, that the illustrated C/E/P/C selection circuit 60 is just one exemplary version of such a selection circuit and that various different designs of the C/E/P/C selection circuit 60 may be used to select various different signals in accordance with the present invention.

Figure 10:
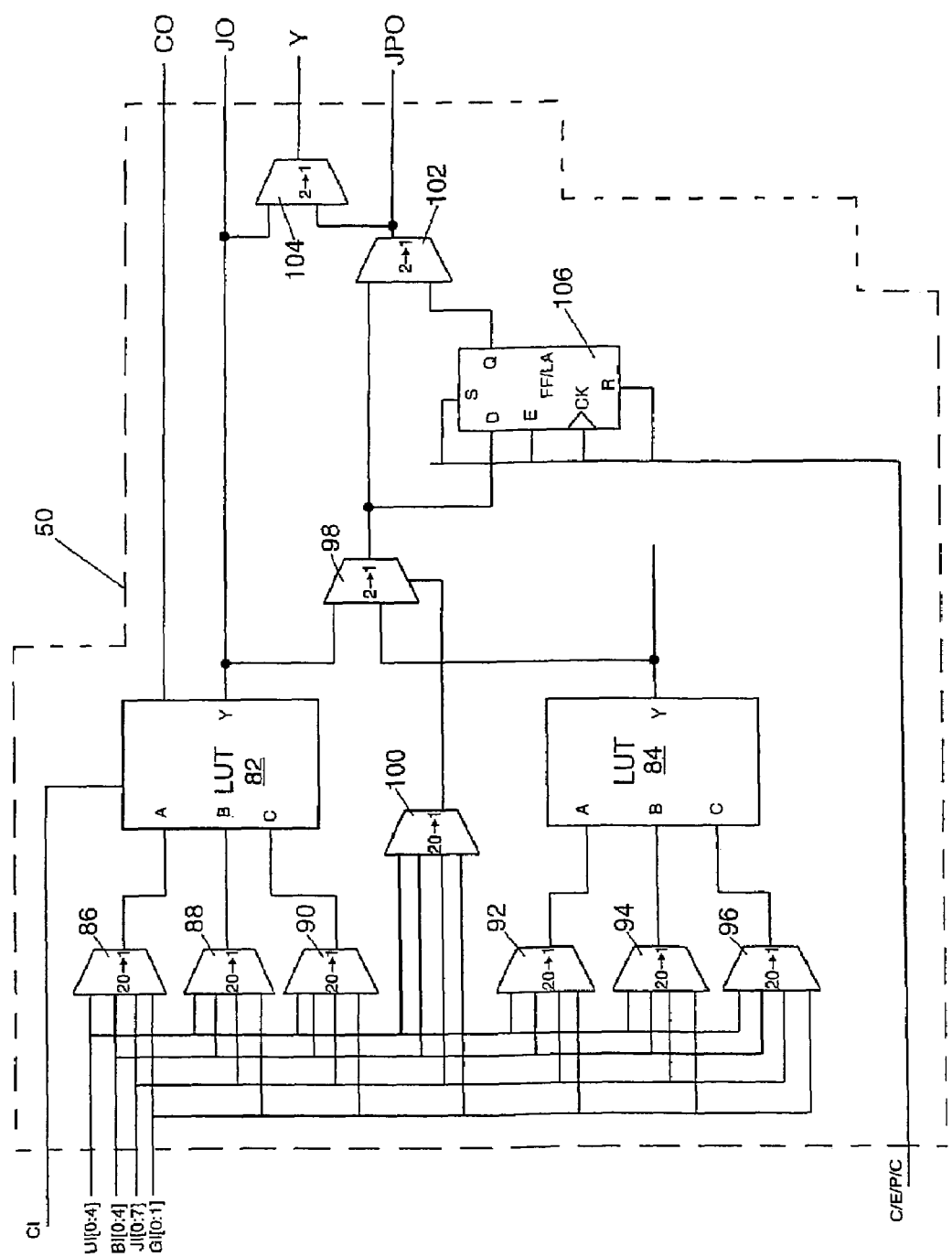
FIG. 10 is a schematic diagram illustrating in further detail one of the logic units (LU) shown in FIG. 7.

Referring to FIG. 10, there is illustrated an exemplary version of the LU 50. The LUs 50, 52, 54, 56 are preferably all of the same design, but it should be understood that such is not required in accordance with the present invention. The LU 50 includes two look-up tables (LUT) 82, 84. Each LUT 82, 84 includes three inputs A, B, C, an output Y, and several internal memory cells (not shown). The LUTs 82, 84 are configured by programming the internal memory cells, and the specific setting of the internal memory cells taken together provides a specific configuration for each of the LUTs 82, 84. The configuration data used to program the internal memory cells is generated by design software. Once a specific configuration of the internal memory cells is decided upon, the inputs A, B, C may be used to generate the output Y in accordance with the desired logic function.

The inputs A, B, C of the LUT 82 are provided by the twenty-to-one multiplexers 86, 88, 90, respectively, and the inputs A, B, C of the LUT 84 are provided by the twenty-to-one multiplexers 92, 94, 96, respectively. Each of the multiplexers 86, 88, 90, 92, 94, 96 receives as inputs the four buses EUI[0:4], EBI[0:4], JI[0:7], and GI[0:1]. Therefore, three signals are selected from these twenty signals as the inputs A, B, C for each of the LUTs 82, 84.

When only a three input LUT is needed, the LUT 82 can be used by itself and the LUT 84 is not needed. The Y output of the LUT 82 can be sent directly to the JO output of the LU 50, or the Y output of the LUT 82 can be sent to the Y output of the LU 50 by using the two-to-one multiplexer 104 to select the Y output of the LUT 82. Additionally, the Y output of the LUT 82 can be sent to the JPO output of the LU 50 by using the two-to-one multiplexer 98 to select the Y output of the LUT 82 and the two-to-one multiplexer 102 to select the output of the multiplexer 98. Thus, the multiplexers 98, 102, 104 can be used to send the Y output of the LUT 82 to any of the outputs Y, JO, JPO of the LU 50.

One purpose of including two LUTs 82, 84 in the LU 50 is so that they can be used together to provide a four-input LUT. Specifically, the Y output of the LUT 82 and the Y output of the LUT 84 are connected to the inputs of the two-to-one multiplexer 98. The multiplexer 98 is controlled by the twenty-to-one multiplexer 100 which receives as its inputs the four buses EUI[0:4], EBI[0:4], JI[0:7], and GI[0:1]. The LUTs 82, 84 both receive the first, second and third inputs at their A, B, C inputs, and the multiplexer 100 is programmed to select the fourth input and provide it to the control input of the multiplexer 98. According to well-known Boolean logic techniques and the Shannon Expansion, connecting the three-input LUTs 82, 84 in this manner will simulate a single four-input LUT with the result being generated at the output of the multiplexer 98. The output of the multiplexer 98 can be provided to the JPO output of the LU 50 by way of the multiplexer 102 or to the Y output of the LU 50 by way of the multiplexers 102, 104.

A flip-flop 106 is preferably also included in the LU 50. Specifically, the D input of the flip-flop 106 is connected to the output of the multiplexer 98, and the Q output of the flip-flop 106 is connected to one of the inputs of the multiplexer 102. The clock, enable, set and reset inputs of the flip-flop 106 are connected to the corresponding signals of the C/E/P/C bus. One purpose of the flip-flop 106 is to store the output data of the multiplexer 98. This data can be stored and later sent to the JPO output of the LU 50 by selecting the Q output with the multiplexer 102. The stored data can also be sent to the Y output of the LU 50 by selecting the JPO signal with the multiplexer 104. The inclusion of the flip-flop 106 in the LU 50 adds to the flexibility of the device in that output data of the LU 50 can be stored and used at a later time.

Figure 11:
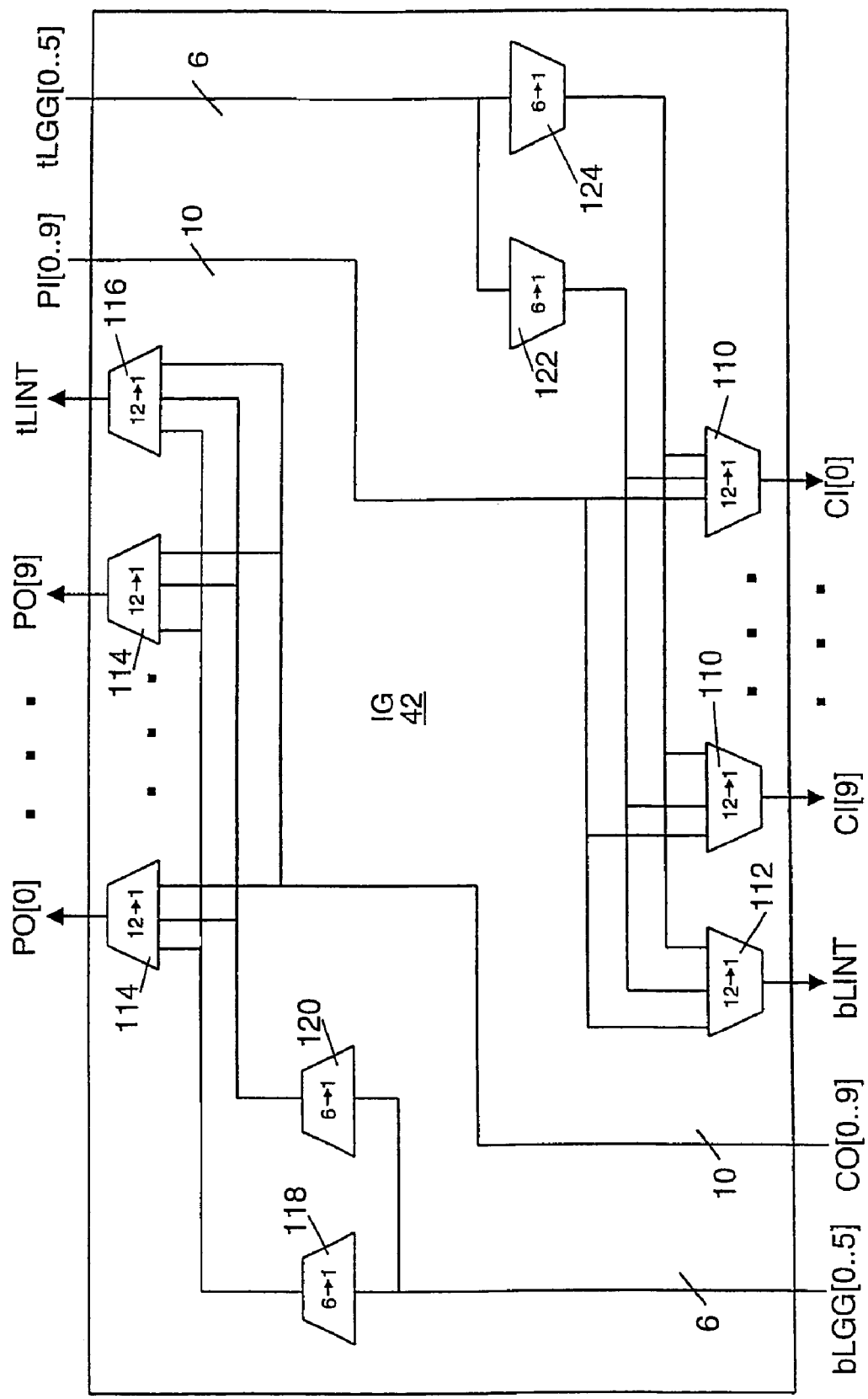
FIG. 11 is a block diagram illustrating in further detail one of the interface groups (IGs) shown in FIG. 5.

Referring to FIG. 11, there is illustrated the internal components of an exemplary version of one of the IGs 42. As mentioned above, the IGs 42 are used for interfacing the FPGA tile 20 to other FPGA tiles or devices, or to pad rings for connecting the FPGA tile 20 to IC package pins. The PI[0:9] bus is used to receive data from outside of the FPGA tile 20 and pass the data to the first set of routing conductors inside of the FPGA tile 20 via the CI[0:9] bus. The CO[0:9] bus is used to receive data from the first set of routing conductors inside of the FPGA tile 20 and pass the data to outside of the FPGA tile 20 via the PO[0:9] bus.

Similar to the FG 40, the IG 42 also receives LINT signals via the second set of routing conductors. Specifically, for signals coming into the FPGA tile 20, the PI[0:9] bus is coupled to ten, twelve-to-one multiplexers 110 that select the signals which form the CI[0:9] bus. If, however, the first set of routing conductors that is coupled to the CI[0:9] bus is unable to route a signal to the desired location within the FPGA tile 20, the signal can be selected as the "bLINT" signal by the twelve-to-one multiplexer 112. The bLINT signal is routed by the same second set of routing conductors that is used to the route the LINT signals generated by the FGs 40. As such, the bLINT signal can be routed along this second set of routing conductors to any of the FGs 40 and/or IGs 42 in the FPGA tile 20. This provides a way to route any of the incoming signals PI[0:9] to any destination within the FPGA tile 20 even if the first set of routing conductors carrying the CI[0:9] bus does not provide a path to that destination.

Similarly, for signals leaving the FPGA tile 20, the CO[0:9] bus is coupled to ten, twelve-to-one multiplexers 114 that select the signals which form the PO[0:9] bus. If, however, the first set of routing conductors that are coupled to the PO[0:9] bus are unable to route a signal to the desired location outside of the FPGA tile 20 (e.g., in a neighboring FPGA tile), the signal can be selected as the "tLINT" signal by the twelve-to-one multiplexer 116. The tLINT signal is routed by a second set of routing conductors that is used to route the signals from a second output port LINT in the neighboring FPGA tile, and as such, the tLINT signal can be routed to any of the FGs and/or IGs in the neighboring FPGA tile. This provides a way to route any of the outgoing signals CO[0:9] to any destination within the neighboring FPGA tile even if the first set of routing conductors carrying the PO[0:9] bus does not provide a path to that destination.

As mentioned above, the second set of routing conductors within the FPGA tile 20 that carries LINT signals includes the LGG[0:5] bus. Specifically, several LINT signals that need to be routed around the FPGA tile 20 are grouped together and travel via the LGG[0:5] bus. The LGG[0:5] bus is provided to every FG 40 and IG 42 so that LINT signals can be sent to every device. The IGs 42 receive the LGG[0:5] bus from inside of the FPGA tile 20 at input bLGG[0:5]. The bLGG[0:5] input is coupled to the six-to-one multiplexers 118, 120, which have their outputs coupled to the multiplexers 114, 116. In this way, any LINT signal generated within the FPGA tile 20 can be sent outside of the FPGA tile 20 on the PO[0:9] bus or as the tLINT signal by programming the appropriate multiplexers 114, 116 to select the outputs of the appropriate multiplexers 118, 120.

Similarly, an LGG bus in a neighboring FPGA tile can be connected to the tLGG[0:5] input of the IG 42. The tLGG[0:5] input is coupled to the six-to-one multiplexers 122, 124, which have their outputs coupled to the multiplexers 110, 112. In this way, any LINT signal generated outside of the FPGA tile 20 can be sent inside the FPGA tile 20 on the CI[0:9] bus or as the bLINT signal by programming the appropriate multiplexers 110, 112 to select the outputs of the appropriate multiplexers 122, 124.

Figure 12:
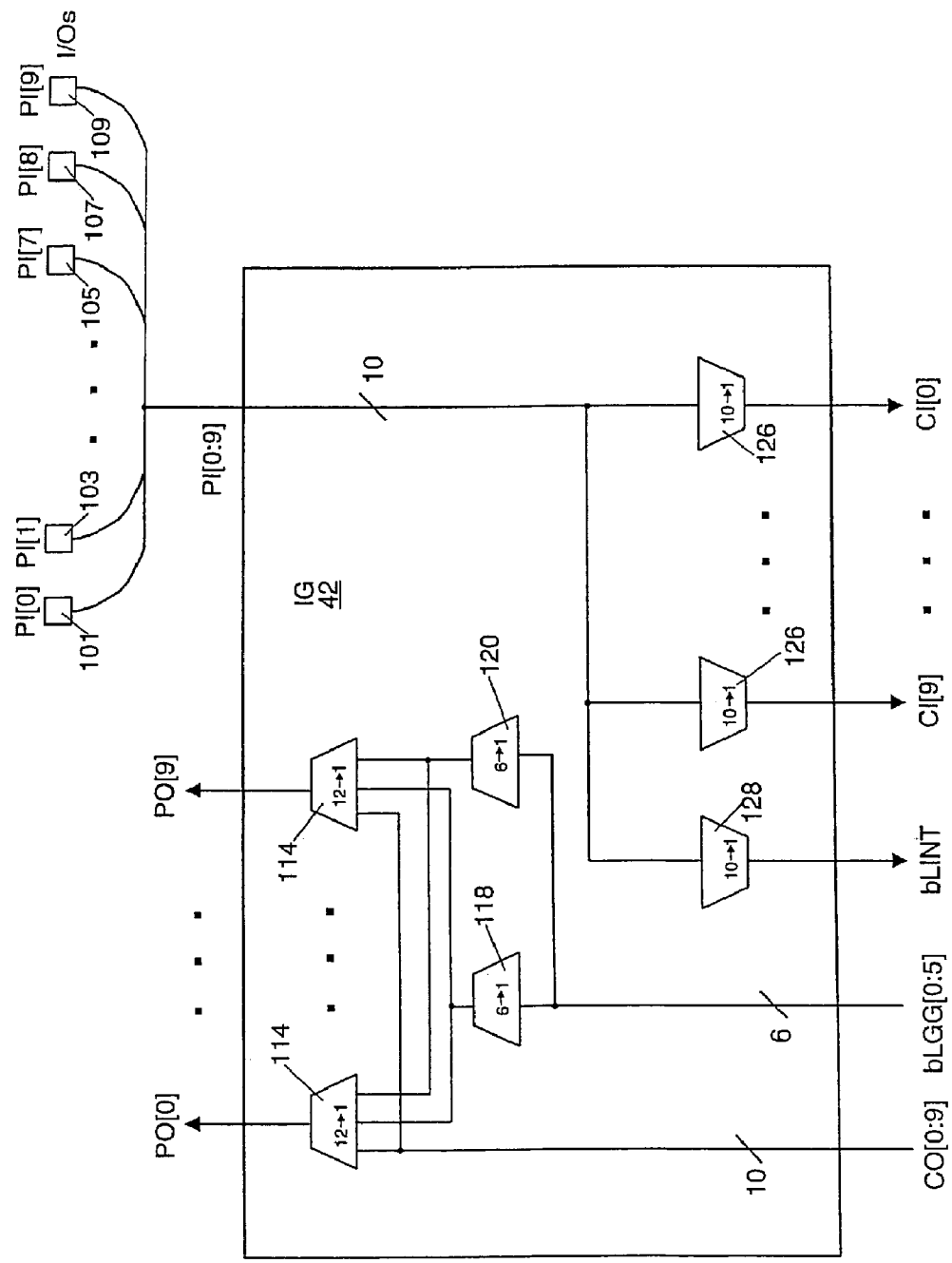
FIG. 12 is a block diagram illustrating in further detail an alternative version of one of the interface groups (IGs) shown in FIG. 5.

It should be understood that in certain situations the tLINT signal and tLGG[0:5] bus may not be needed and can be eliminated from the IG 42 in accordance with the present invention. This is illustrated in FIG. 12 which shows an alternative IG 42' having no tLINT or tLGG[0:5] inputs. An example of a situation where the tLINT signal and tLGG[0:5] bus are not needed is where the IG 42' is used to couple the FPGA tile 20 to a pad ring, such as one of the pad rings 28, 30, 32, 34. In this scenario the PO[0:9] outputs and the PI[0:9] inputs will be coupled through the pad ring to the IC package I/Os (i.e., the IC package input/output pins). This is illustrated in the figure for the PI[0:9] bus in that the PI[0:9] bus is coupled to several I/Os 101, 103, 105, 107, 109. There will typically be no second set of routing conductors in the pad rings to make use of the tLINT signal and tLGG[0:5] bus. The multiplexers 116, 122, 124 are eliminated, and the multiplexers 110, 112 are replaced with ten-to-one multiplexers 126, 128.

FIG. 12 also illustrates another important feature of the present invention. Specifically, in the scenario where a side of the FPGA tile 20 is to be coupled to a pad ring for I/O purposes, the I/Os 101, 103, 105, 107, 109 may be directly coupled to the IG 42'. Furthermore, the I/Os 101, 103, 105, 107, 109 may be directly coupled to the multiplexers 126, 128. In other words, the I/Os 101, 103, 105, 107, 109 can be directly coupled to the multiplexers 126, 128 without first connecting to a routing channel. The connection to a routing channel is made after the IG 42' and multiplexers 126, 128. Thus, in this scenario, I/Os are directly coupled to the multiplexers 126, 128 and then go on to the routing channel or other routing resources.

It should also be understood that the IGs of two neighboring FPGA tiles may be combined into one IG in accordance with the present invention. For example, with the IG 42 shown in FIG. 11, the PO[0:9], PI[0:9], tLGG[0:5] buses and the tLINT output port will typically not be coupled to a separate IG of a neighboring tile, but rather, these input and output ports will be coupled into the routing structures of the neighboring FPGA tile and the IG 42 will also serve as the IG of the neighboring tile.

By way of example, any of the multiplexers (selection circuits) discussed herein, such as for example multiplexers 86, 88, 90, 92, 94, 96, 98, 100, 102, 104, may comprise any of the selection circuits described in United States Publication Number US-2001-0011908-A1, the full disclosure of which is hereby incorporated into the present application by reference.

Figure 13:
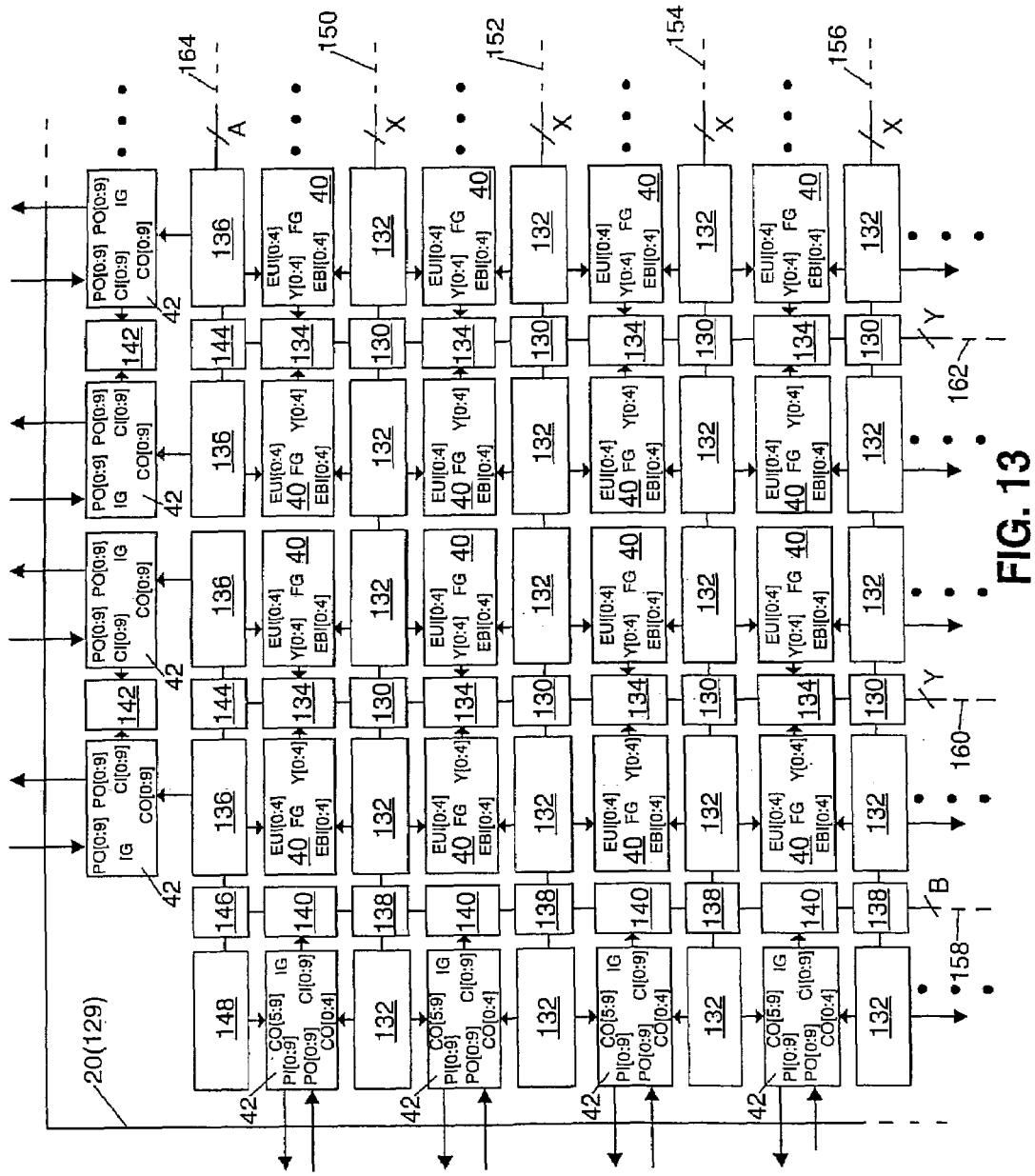
FIG. 13 is a schematic diagram illustrating in further detail a portion of the FPGA tile shown in FIG. 5.

Referring to FIG. 13, there is illustrated a more detailed diagram showing approximately one-quarter of an exemplary version of the FPGA tile 20. The portion of the FPGA tile 20 that is illustrated is designated by 129 in FIG. 5. It will be appreciated by those of ordinary skill in the art that the remaining portions of the FPGA tile 20 are mirror images of the illustrated portion 129.

FIG. 13 illustrates the first set of routing conductors of the FPGA tile 20 that is used to route signals via input and output ports 44 of the FGs 40. As discussed above, the input and output ports 44 carry the signals to first input ports EUI[0:4], EBI[0:4], and the signals from first output ports Y[0:4]. The first set of routing conductors of the FPGA tile 20 also handles routing of the CO[0:9] and CI[0:9] buses to and from the IGs 42.

The first set of routing conductors of the FPGA tile 20 includes first horizontal routing buses 150, 152, 154, 156 and several vertical regular routing buses 158, 160, 162. By way of example, the horizontal routing buses 150, 152, 154, 156 may each include X number of lines, the horizontal routing bus 164 may include A number of lines, the vertical routing buses 160, 162 may each include Y number of lines, and the vertical routing bus 158 may include B number of lines. By way of further example, the horizontal routing buses 150, 152, 154, 156 may each include 50 lines, the horizontal routing bus 164 may include 70 lines, the vertical routing buses 160, 162 may each include 60 lines, and the vertical routing bus 158 may include 70 lines.

In order to transfer data from one routing bus to another routing bus or to an FG 40 or an IG 42, several routing interconnect areas 130, 132, 134, 136, 138, 140, 142, 144, 146, 148 are included in the FPGA tile 20. The routing interconnect areas 130, 138, 144, 146 are used to transfer data from one of the vertical routing buses to one of the horizontal routing buses. The other routing interconnect areas 132, 134, 136, 140, 142, 148 are used to transfer data to or from one of the IGs 42 or one of the FGs 40 to or from one of the vertical routing buses or one of the horizontal routing buses. In general, the routing buses and the routing interconnect areas form the regular routing structure of the FPGA tile 20.

Figure 14:
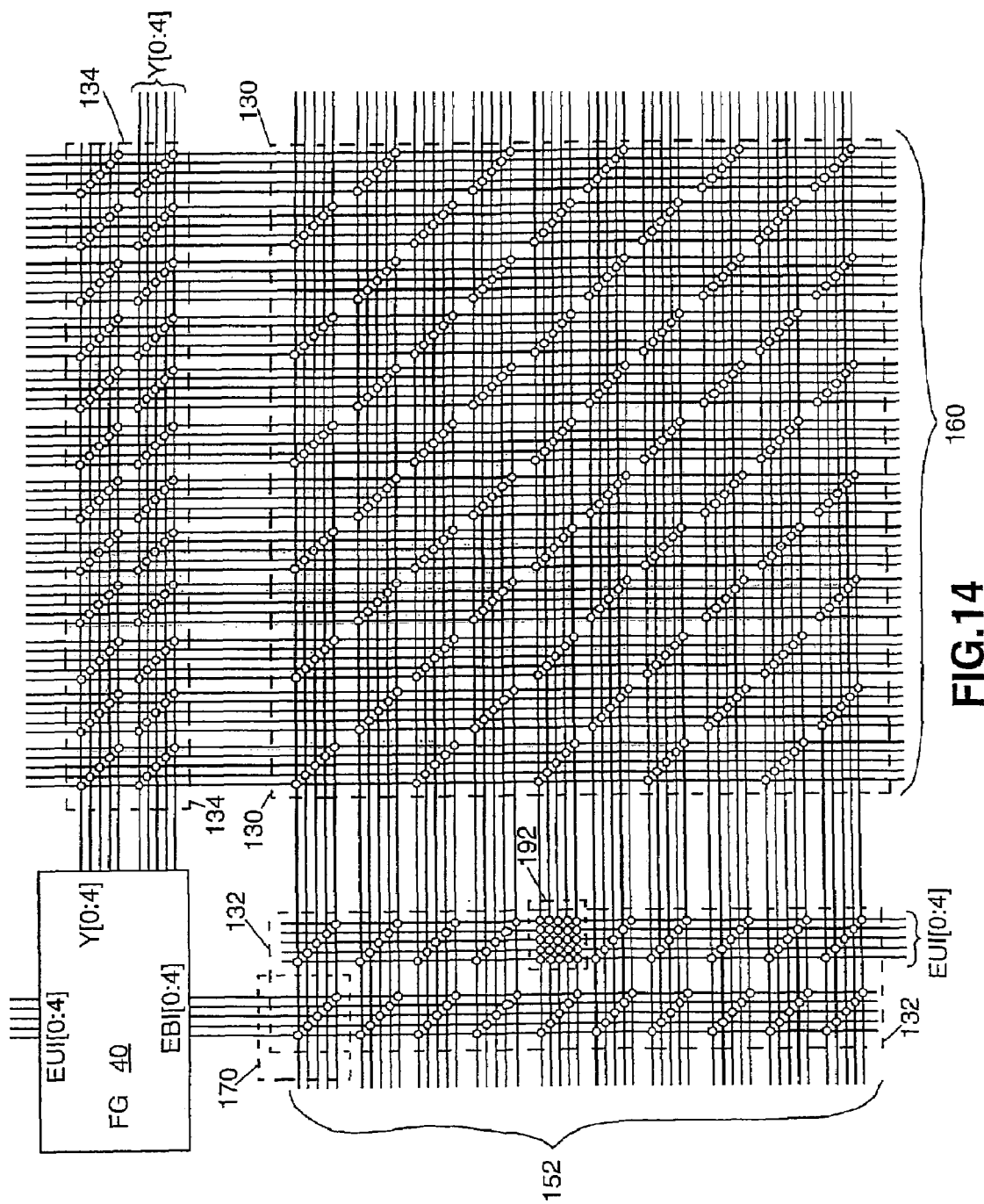
FIG. 14 is a schematic diagram illustrating in further detail a portion of the regular routing structure shown in FIG. 13.

FIG. 14 illustrates an exemplary structure for the routing interconnect areas 130, 132, 134. In this example, the horizontal routing bus 152 includes 50 lines and the vertical routing bus 160 includes 60 lines. It should be well understood, however, that the specific number of lines in any of the routing buses may vary in accordance with the present invention. Furthermore, it should be well understood that the specific number of lines in any of the signal buses, such as for example EUI[0:4], EBI[0:4], Y[0:4], LGG[0:5], GG[0:7], JI[0:7], GI[0:1], CO[0:9], CI[0:9], PO[0:9], PI[0:9], may vary in accordance with the present invention.

Figure 15:
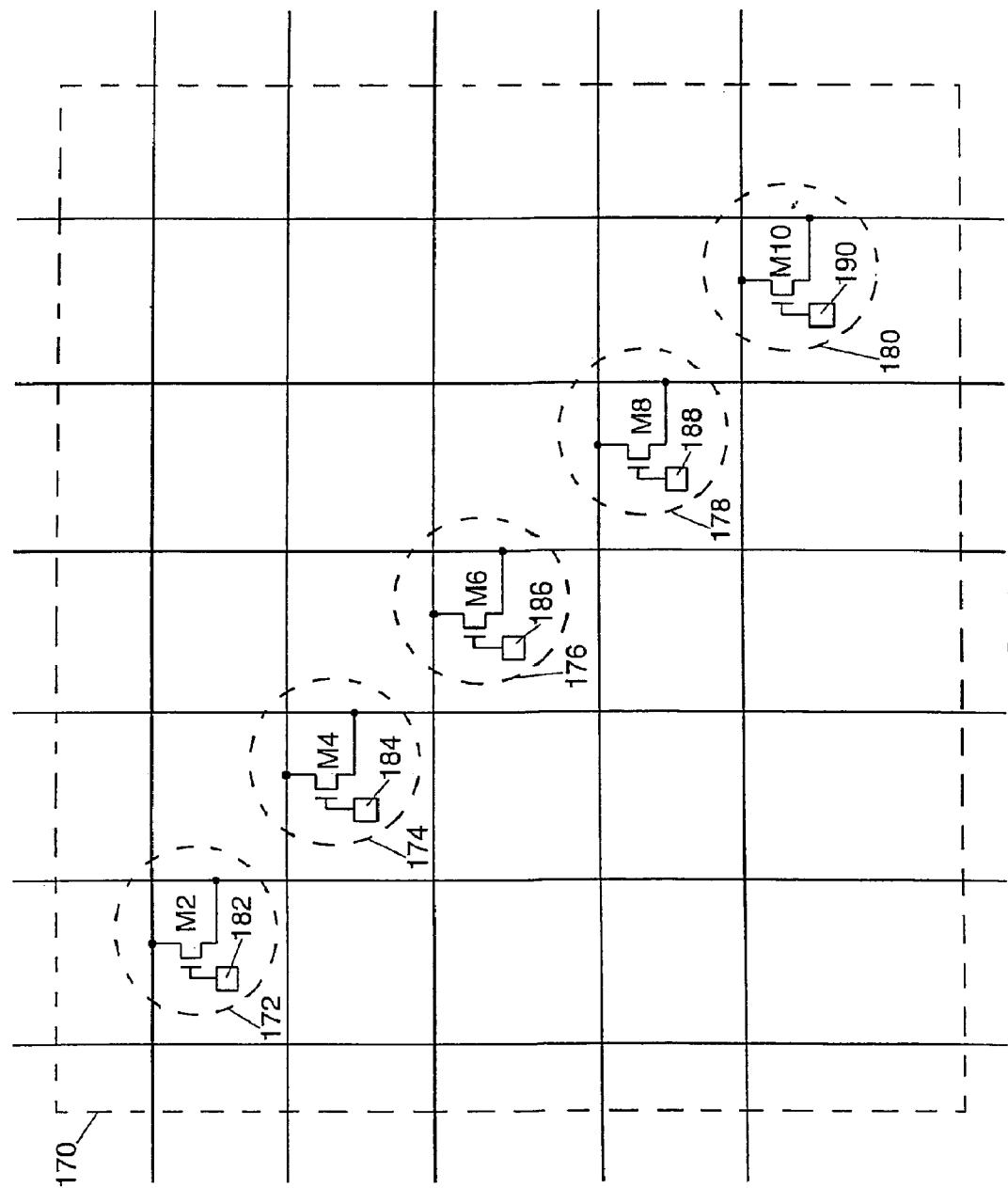
FIG. 15 is a schematic diagram illustrating in further detail a portion of the first set of routing conductors as shown in FIG. 14.

Each of the routing interconnect areas 130, 132, 134 includes several transistor switches and corresponding memory cells which are used for making the connections between the various buses. Each transistor switch and memory cell is illustrated in the figure as a circle (or bubble) drawn at the intersection of signal lines to be coupled together. In order to illustrate this, FIG. 15 shows a detail of the circles designated by 170. The circles 172, 174, 176, 178, 180 include transistor switches M2, M4, M6, M8, M10, respectively. Each of the transistor switches M2, M4, M6, M8, M10 has its source and drain coupled to intersecting signal lines and its gate coupled to a corresponding memory cell 182, 184, 186, 188, 190. Each of the memory cells stores one bit of configuration data to control whether or not its corresponding transistor switch is turned on or off. When a transistor switch is turned on, the lines to which it is connected are coupled together.

Referring back to FIG. 14, the operation of the first set of routing conductors and the routing interconnect areas will be described in further detail. One of the FGs 40 and its nearby routing interconnect areas 130, 132, 134 are illustrated. The Y[0:4] output port of the FG 40 is coupled to the routing interconnect area 134, and the EBI[0:4] input port of the FG 40 is coupled to the routing interconnect area 132. In a typical scenario, the FG 40 outputs data onto the Y[0:4] bus and the routing interconnect area 134 is used to transfer that data onto bus 160. This is done by turning on the transistor switch inside the illustrated circle (or bubble) at the appropriate intersection of signal lines. Each transistor switch is turned on by programming its corresponding memory cell. Similarly, the routing interconnect area 132 is used to transfer data from bus 152 onto the EBI[0:4] bus of the FG 40. Again, this is accomplished by programming the memory cell to turn on the transistor switch at the appropriate intersection. The routing interconnect area 130 is used to transfer data from bus 160 onto bus 152, again by programming the memory cell to turn on the transistor switch at the appropriate intersection.

As illustrated, the routing interconnect areas 130, 132, 134 include transistor switches and memory cells at many intersections of signal lines, but not at all intersections. (Again, the transistor switches and memory cells are inside the illustrated circles or bubbles). When a transistor switch and memory cell is included at every intersection of signal lines, this is known as a "fully populated" routing interconnect portion. A fully populated routing interconnect portion is shown in the routing interconnect area 132 at 192. It should be well understood that the specific intersections chosen to have a transistor switch and memory cell, and which areas are fully populated (if any), may vary widely in accordance with the present invention. In other words, many different patterns of transistor switches and memory cells may be used in the routing interconnect areas 130, 132, 134 in accordance with the present invention.

The other routing interconnect areas 136, 138, 140, 142, 144, 146, 148 in the FPGA tile 20 are similar to the routing interconnect areas 130, 132, 134. Some, however, will have different numbers of signal lines and intersections. For example, the routing interconnect areas 136, 144 may have a greater number of signal lines in the horizontal bus 164 due in part to ten signals (instead of five) being transferred to the CO[0:9] bus of the IGs 42. Similarly, the routing interconnect areas 146, 148 will have fewer inputs and/or outputs because they are located at the end of a row.

The number of transistor switches used and their positioning in the FPGA tile 20 can change in accordance with the present invention. The specific arrangement and positioning of IGs, FGs, routing buses, routing interconnect areas, and switching transistors within routing interconnect areas will vary greatly depending on the particular application. It should be understood that the configurations illustrated in the figures herein are example configurations.

Figure 16A:
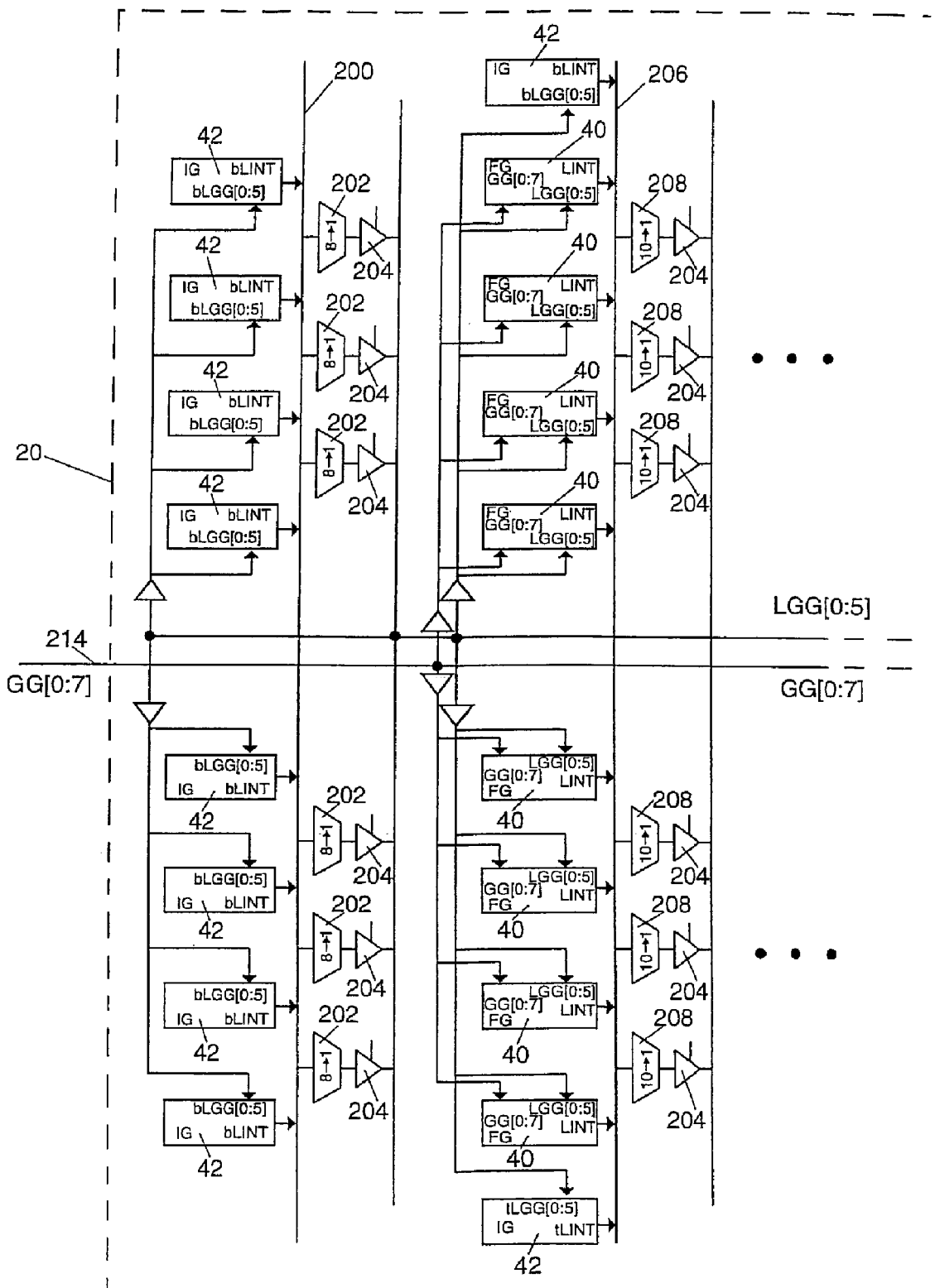
FIGS. 16A and 16B are schematic diagrams illustrating the second set of routing conductors included in the FPGA tile shown in FIG. 5.
Figure 16B:
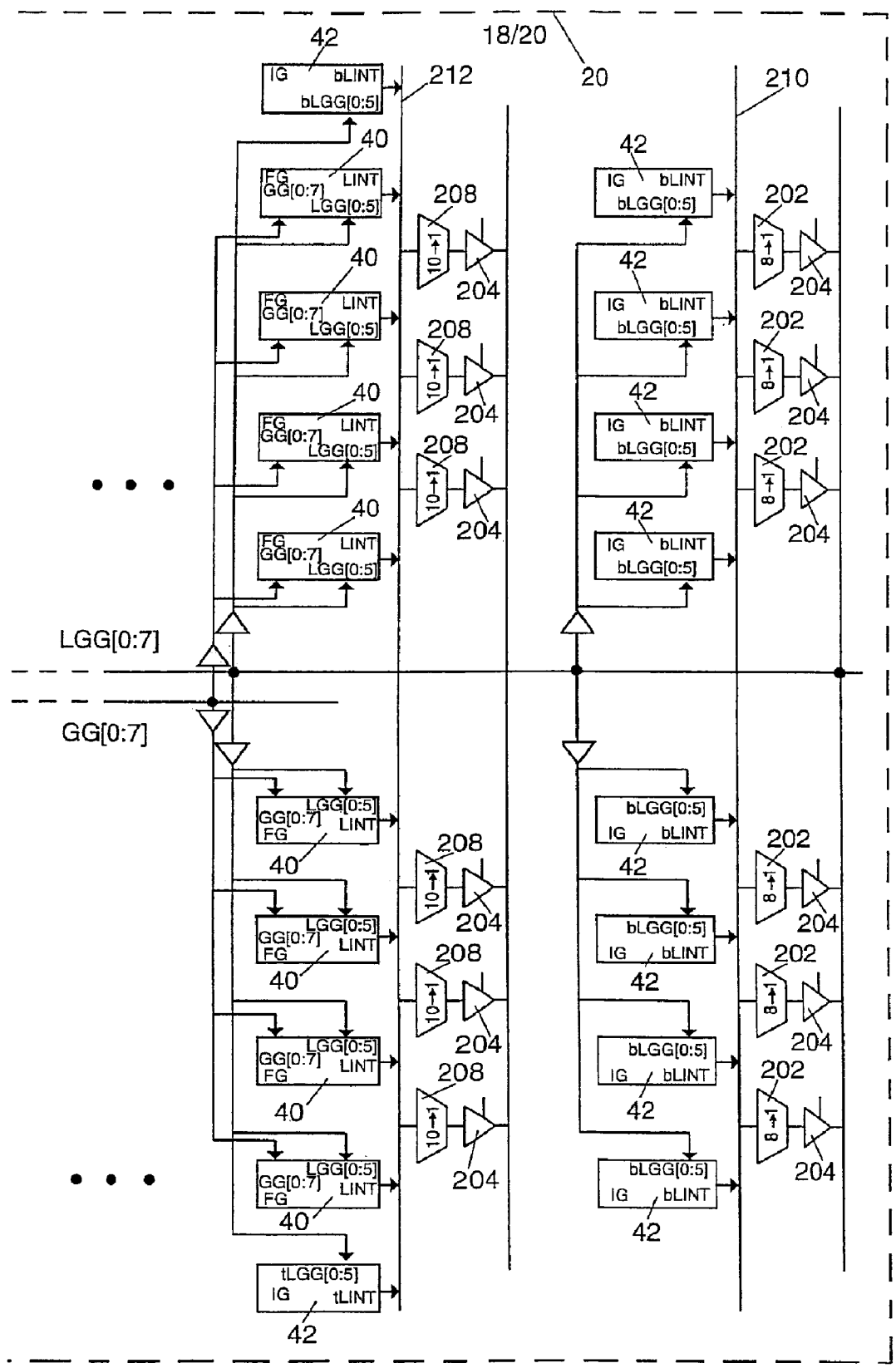

FIGS. 16A and 16B illustrate the second set of routing conductors of the FPGA tile 20. As discussed above, the second set of routing conductors is separate from the first set of routing conductors and routing interconnect areas used to route the output signals Y[0:4]. The second set of routing conductors is used for routing signals via input and output ports 46 which include input port LGG[0:5] and output port LINT. The LINT routing structure is a second set of routing conductors that can be used to send a signal in situations when the first set of routing conductors cannot be used to send a signal to the intended destination. This may occur because a transistor switch and memory cell may not have been placed at the needed intersection of signal lines in one or more of the first set of routing conductors regular routing interconnect areas 130, 132, 134, 136, 138, 140, 142, 144, 146, 148. If the needed connections cannot be made with the first set of routing conductors interconnect areas, the signal can be sent to any of the FGs 40 and/or IGs 42 by selecting the needed one of the output signals Y[0:4] as the LINT signal as described above and sending it over the second set of routing conductors.

The signals sent via the LINT output port of six devices, which can be any combination of FGs 40 and/or IGs 42, are assembled to form the LGG[0:5] bus. While the LGG[0:5] bus is illustrated as a six-signal bus, it should be well understood that the number of signals in the LGG bus may vary in accordance with the present invention. Furthermore, the LGG bus is made up of LINT signals from the FGs 40 and bLINT signals from the IGs 42. As discussed above, the "b" designation on the bLINT signals of the IGs 42 indicates that these signals are internal to the FPGA tile 20 as opposed to the external tLINT signals. Therefore, when discussing the formation of the LGG[0:5] bus, use of the term "LINT" will generally be intended to cover both the LINT signal generated by the FGs 40 and the bLINT signal generated by the IGs 42.

The LGG[0:5] bus is assembled as follows. The first column of IGs 42 has their bLINT outputs coupled to an eight-signal bus 200. Six, eight-to-one multiplexers 202 are coupled to bus 200. The output of each of the multiplexers 202 is coupled to a corresponding tri-state buffer 204. The outputs of the tri-state buffers 204 are coupled to the LGG[0:5] bus. In the second column of FGs 40 and two IGs 42, the LINT output of each FG 40 and the bLINT output of each IG 42 are coupled to a ten-signal bus 206. Six, ten-to-one multiplexers 208 are coupled to bus 206. The output of each of the multiplexers 208 is coupled to a corresponding tri-state buffer 204, which in turn are coupled to the LGG[0:5] bus.

In a similar manner, the last column of IGs 42 has their bLINT outputs coupled to an eight-signal bus 210. Six, eight-to-one multiplexers 202 and tri-state buffers 204 couple bus 210 to the LGG[0:5] bus. In the second to last column of FGs 40 and two IGs 42, the LINT output of each FG 40 and the bLINT output of each IG 42 are coupled to a ten-signal bus 212, which in turn is coupled to the LGG[0:5] bus via six, ten-to-one multiplexers 208 and tri-state buffers 204. It should be understood that the rest of the FGs 40 and IGs 42 in the FPGA tile 20 that are not shown in FIGS. 16A and 16B are connected to the LGG[0:5] bus in a similar manner.

During operation, each of the multiplexers 202, 208 selects a LINT signal from its input bus, that is, the respective one of buses 200, 206, 210, 212. Up to six of these selected LINT signals may be placed onto the LGG[0:5] bus. This is done by placing six of the tri-state buffers 204 into a conducting state and placing the remaining tri-state buffers into a non-conducting state. The six tri-state buffers 204 that are placed into a conducting state should correspond to the multiplexers 202, 208 that have selected the desired LINT signals.

The LGG[0:5] bus is routed to all of the FGs 40 and IGs 42 in the FPGA tile 20. In this way, a LINT signal from any of the FGs 40 and IGs 42 can be sent to any of the FGs 40 and IGs 42, independent of the first set of routing conductors used for the Y[0:4] bus.

Referring back to FIGS. 16A and 16B, FIGS. 16A and 16B also show the routing of the GG[0:7] bus. As discussed above, the GG[0:7] bus forms the inter-tile global signals 48. These signals are sent to every FG 40 in all FPGA tiles. Thus, the GG[0:7] bus extends through the border of the FPGA tile 20 as indicated at 214 so that it can go to other FPGA tiles. The GG[0:7] bus extends through the border of the FPGA tile 20 without going through an IG 42. As discussed above, selected ones of the input signals GG[0:7] may be used to control the clock/enable/preset/clear (C/E/P/C) inputs of flip-flops included in each FG 40. It should be understood that the GG[0:7] bus may include more or fewer signals in accordance with the present invention.

Figure 17:
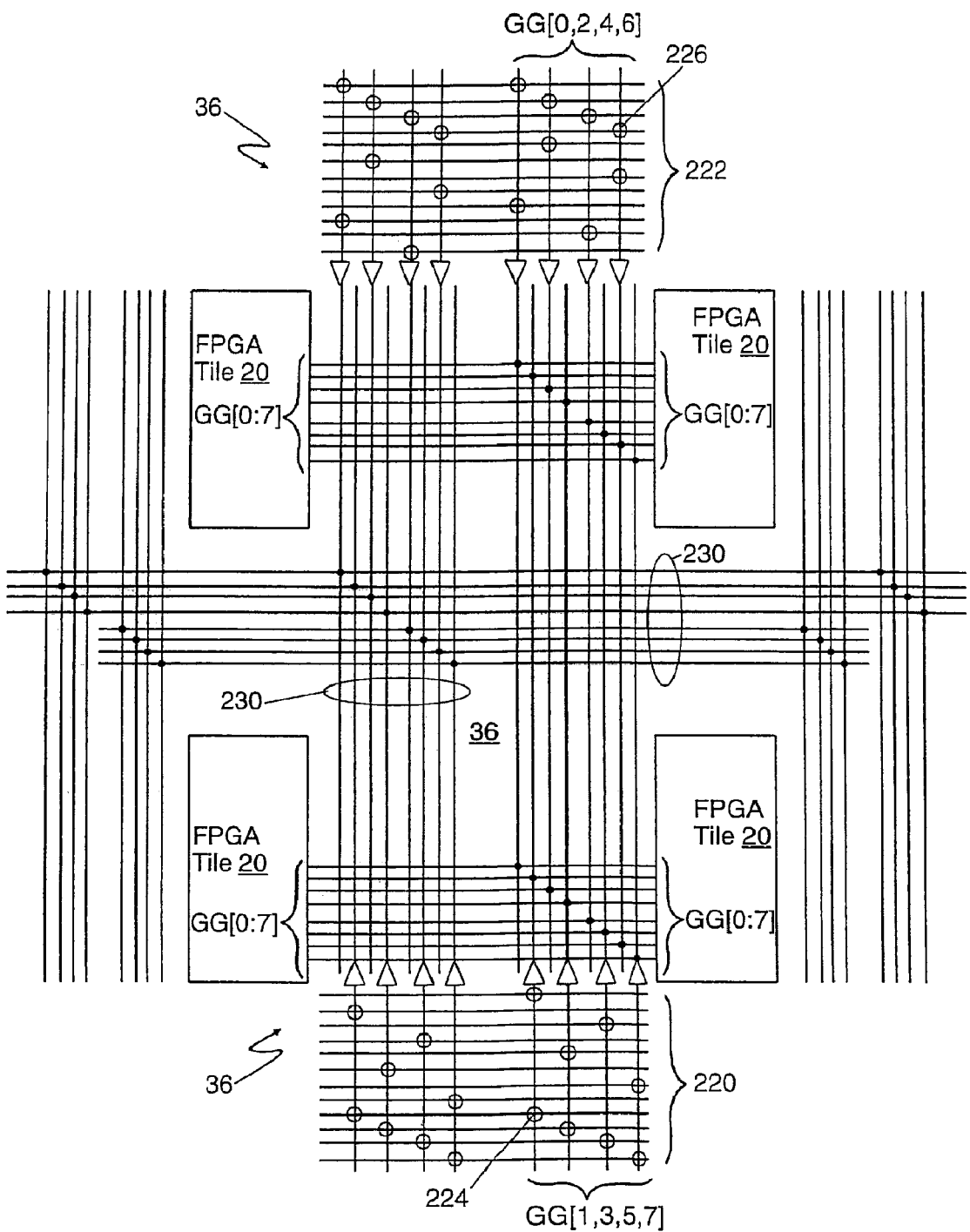
FIG. 17 is a schematic diagram illustrating in further detail the global routing structure shown in FIG. 4.

Referring to FIG. 17, the global signal routing structure 36 is illustrated in more detail. As mentioned above, the global signal routing structure 36 is used to route inter-tile global signals between the FPGA tiles 20. For example, the GG[0:7] bus (which forms the inter-tile global signals 48) is included in the global signal routing structure 36 and is shown connecting to all four FPGA tiles 20. The GG[0:7] bus can be coupled to inputs 220, 222 to send signals that are to be sent on the GG[0:7] bus. Selected ones of the inputs 220, 222 can be coupled to selected signals of the GG[0:7] bus by means of transistor switches and memory cells (such as is described above), examples of which are indicated by circles 224, 226.

As shown, the global signal routing structure 36 also includes bus 230 to connect to the pad ring.

Figure 18:
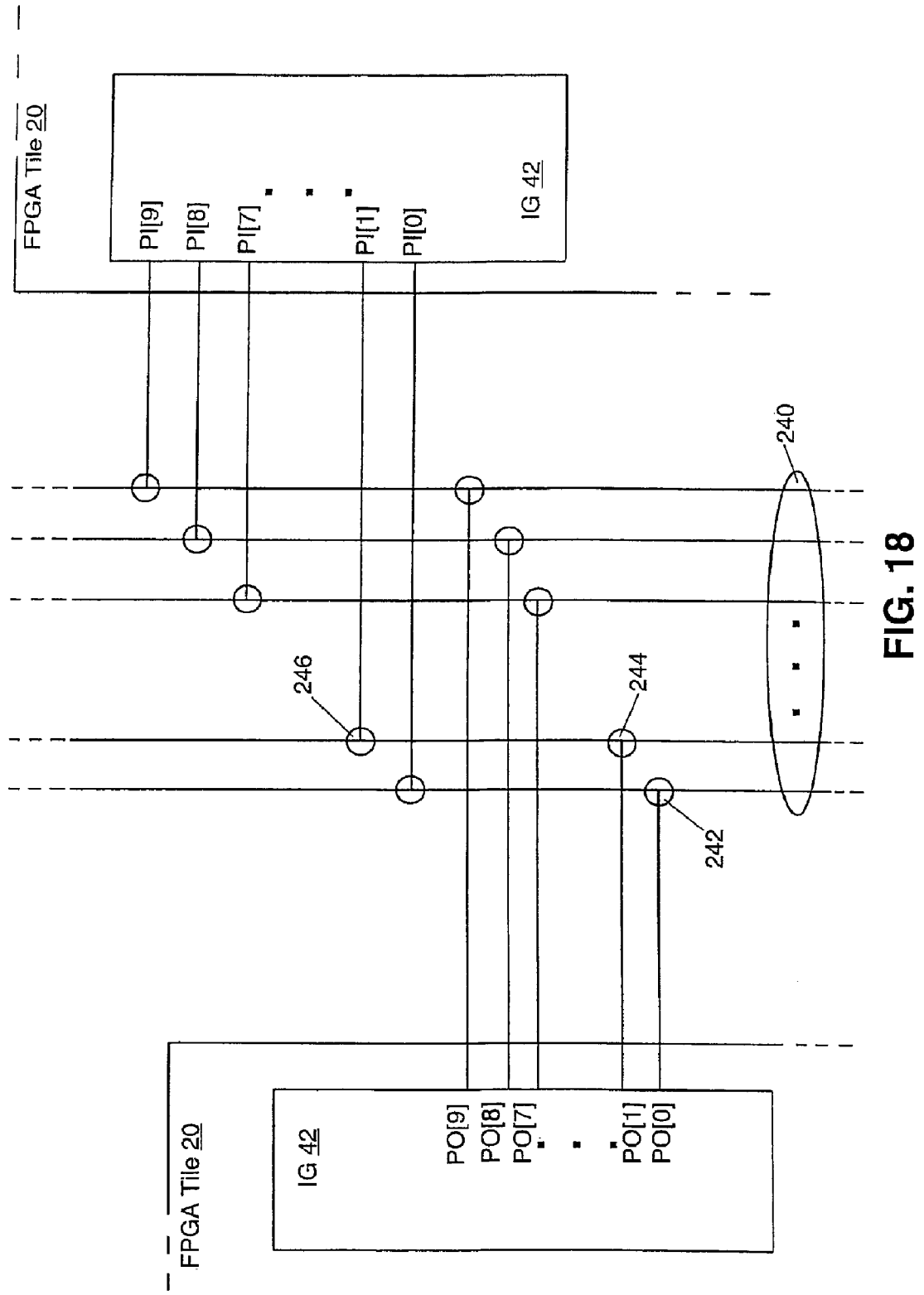
FIG. 18 is a schematic diagram illustrating an optional method of coupling two FPGA tiles together.

When two FPGA tiles 20 are coupled together, the IG outputs of one tile are typically coupled directly to the IG inputs of the other tile. Or, as discussed above, the IGs of the two tiles can be combined as one IG. FIG. 18 illustrates another option for coupling two FPGA tiles 20 together. Specifically, an intermediate routing track 240 may be used. The output PO[0:9] bus of the IG 42 of one tile 20 is coupled to the track 240, and the input PI[0:9] bus of the IG 42 of the other tile 20 is coupled to the track 240 at a different location. The connections to the track 240, for example at points 242, 244, 246, may be by way of hard wired connections for by way of transistor switches and memory cells as described above. The later would, of course, be programmable. It should be understood that the use of the intermediate routing track 240 is optional.

Figure 19:
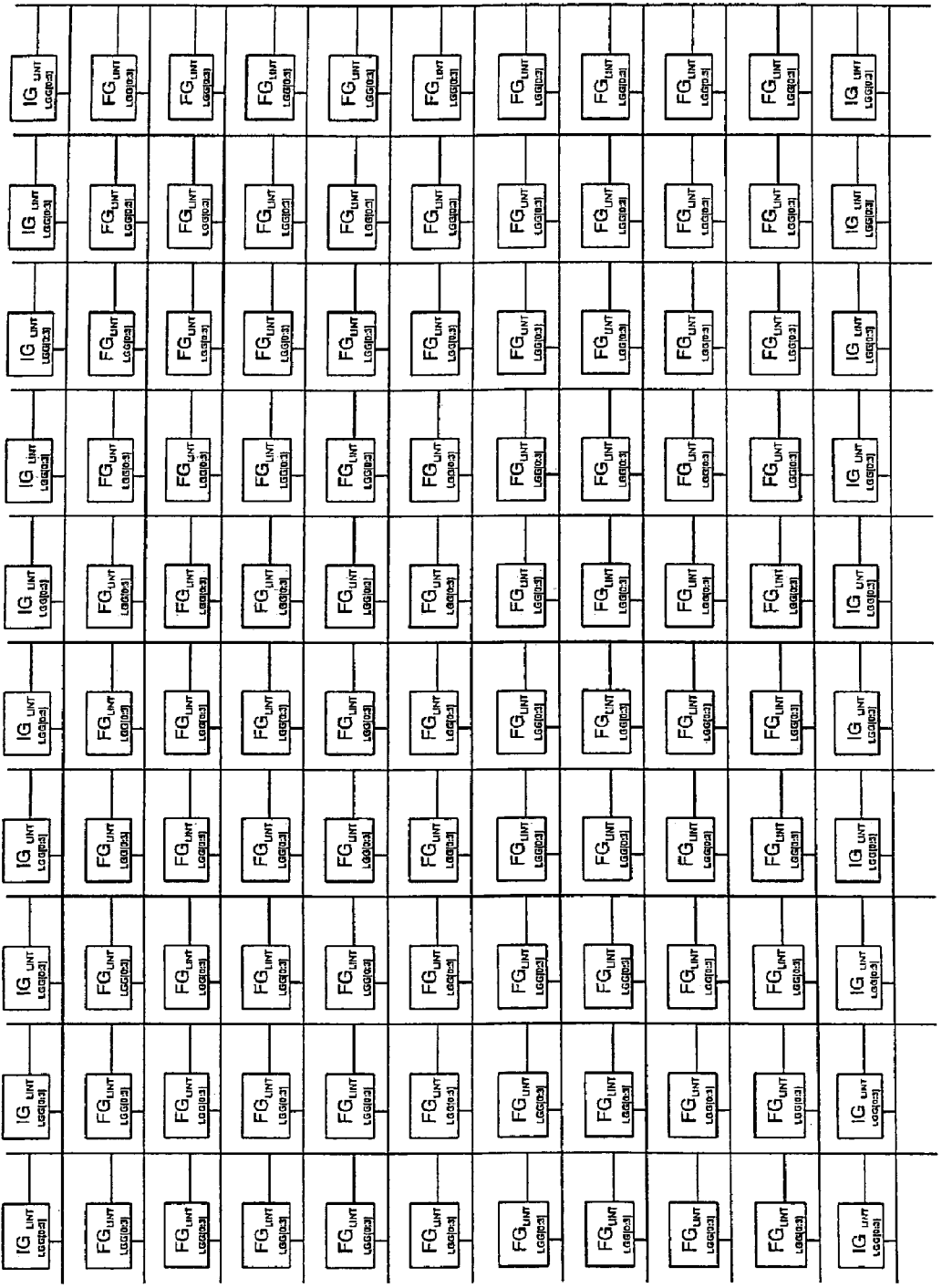
FIG. 19 is a schematic diagram illustrating the input and output ports of the second set of routing conductors included on the FPGA tile shown in FIG. 5.

FIG. 19 shows the LINT signal distribution through a fixed network. As set forth above, The LINT signal is sent via a second set of routing conductors that can be used to send a signal in situations when the first set of routing conductors Y[0:4] cannot be used to send a signal to the intended destination. This may occur because a transistor switch and memory cell may not have been placed at the needed intersection of signal lines in one or more of the regular routing interconnect areas 130, 132, 134, 136, 138, 140, 142, 144, 146, 148. If the needed connections cannot be made with the first set of routing conductors, the signal can be sent to any of the FGs 40 and/or IGs 42 by selecting the needed one of the regular routing output signals Y[0:4] as the LINT signal as described above and sending it over the second set of routing conductors.

Figure 20:
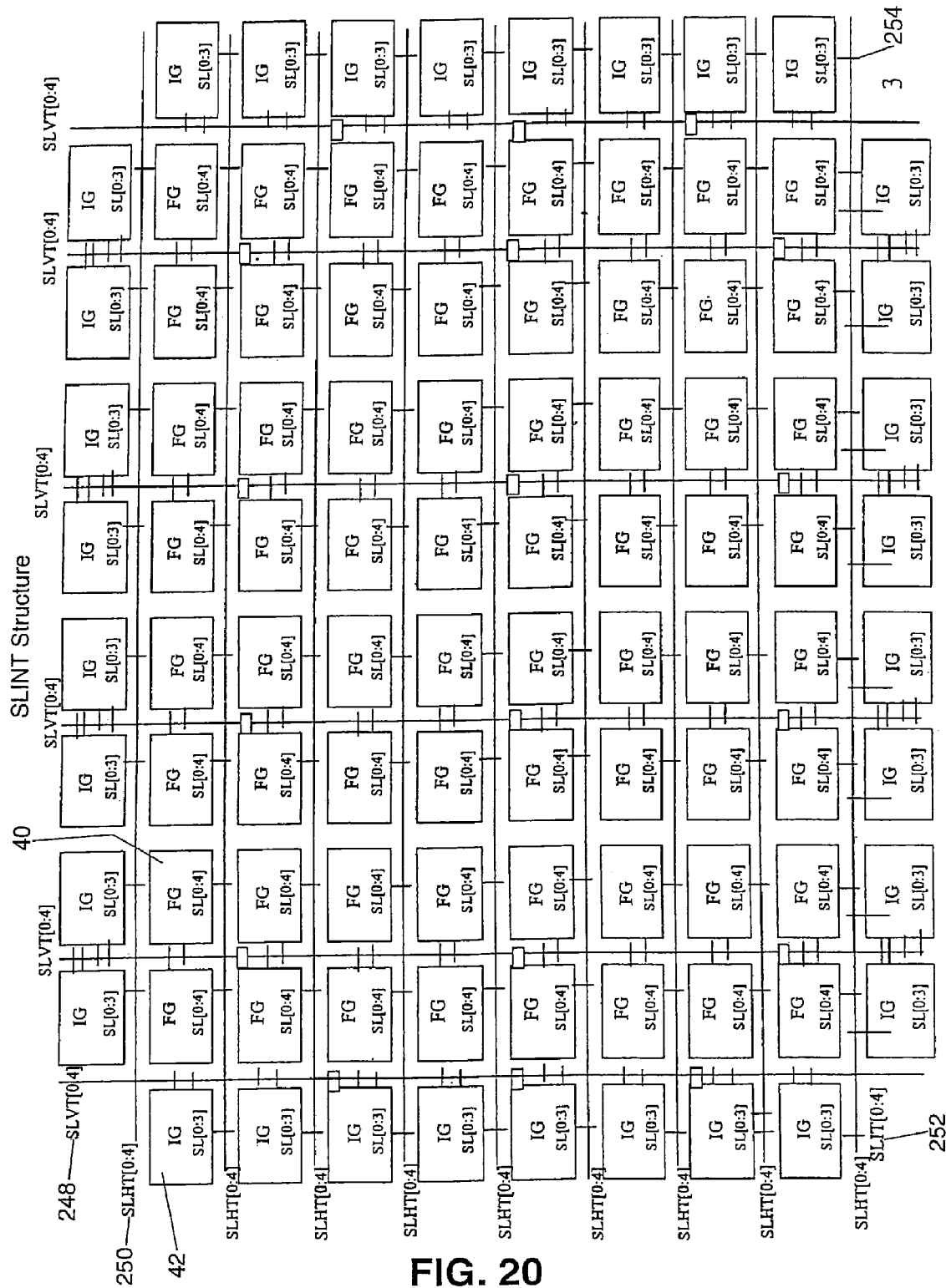
FIG. 20 is a schematic diagram illustrating the input and output ports of the third set of routing conductors shown in FIG. 5
Figure 21:
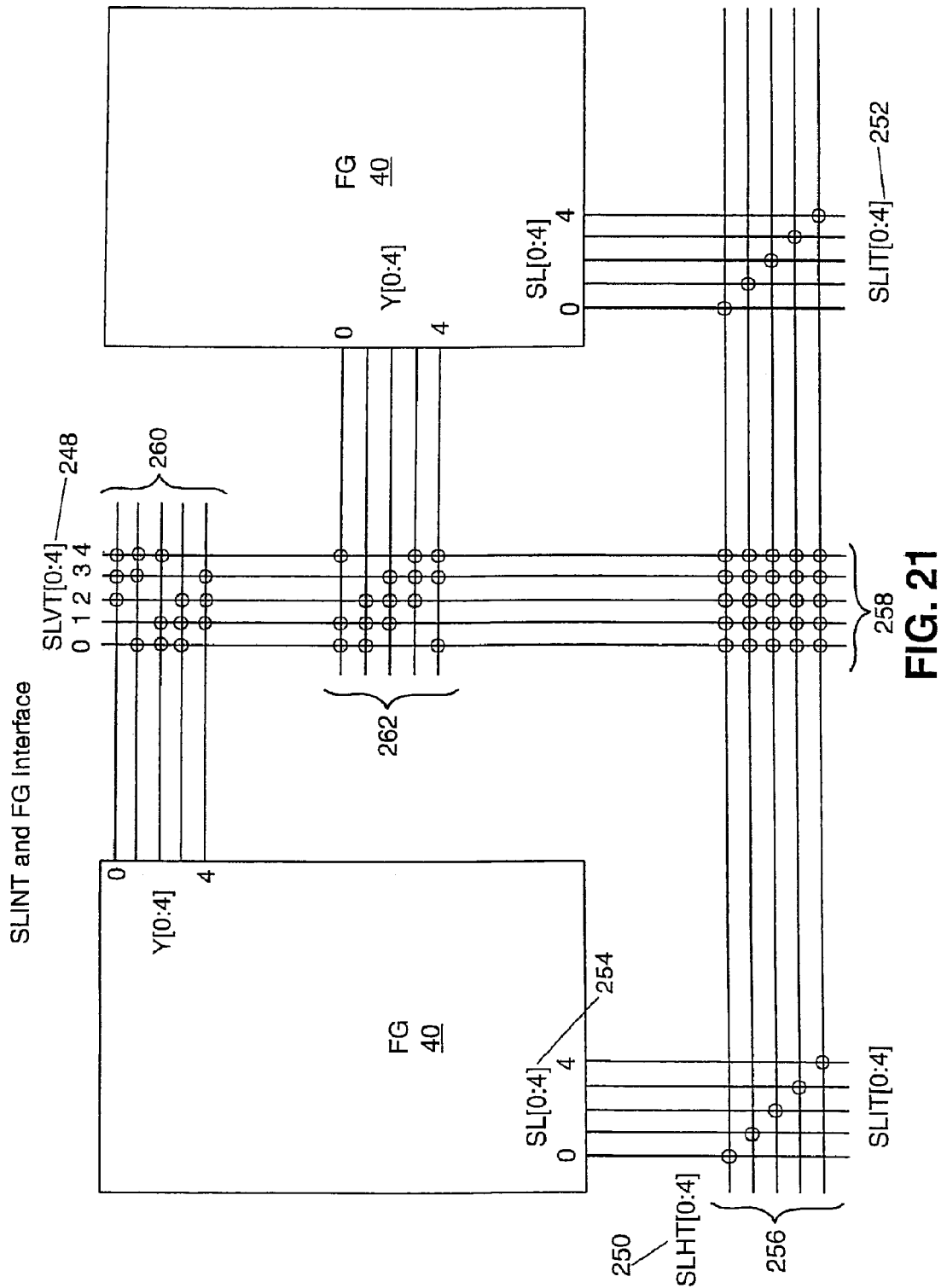
FIG. 21 is a schematic diagram illustrating in further detail a portion of the third set of routing conductors shown in FIG. 20.

FIGS. 20 and 21 show yet another embodiment of the present invention. In this embodiment a third routing structure is added to FPGA tile 20 making FPGA tile 20 extremely flexible and enabling signals to be sent to or from any FG or IG 42. FIGS. 20 and 21 show the SLINT signal distribution through a flexible network. The SLINT network is a third set of routing conductors that can be used to send a signal in situations when the first set of routing conductors 44 cannot be used to send a signal to the intended destination. The SLINT network is an extension of the LINT concept except that the SLINT network employs flexible routing resources with tracks and switches. Every output of an FG 40 Y[0:4] can be used to drive the SLINT network. In addition, every output of an IG 42 PI[0:9] can be used to drive the SLINT network. A signal will be selectively placed in the SLINT network if the first set of routing conductors cannot be used to send a signal. This may occur because a transistor switch and memory cell may not have been placed at the needed intersection of signal lines in one or more of the first set of routing conductors interconnect areas 130, 132, 134, 136, 138, 140, 142, 144, 146, 148. Once in the SLINT network, signals travel through a special set of tracks, SLVT 248, SLHT 250 and SLIT 252 before reaching the third input ports of FGs 40, namely SL[0:4] 254 via input track SLIT[0:4].

FIG. 21 illustrates an exemplary structure for the routing interconnect areas 256, 258, 260 and 262 between adjacent FGs. It should be well understood, however, that the specific number of lines in any of the routing buses may vary in accordance with the present invention. Furthermore, from this disclosure, it will be apparent to persons of ordinary skill in the art that the specific number of lines in any of the signal buses, such as for example Y[0:4], SL[0:4], may vary in accordance with the present invention.

As set forth above, each of the third set of routing conductors interconnect areas 256, 258, 260, 262 includes several transistor switches and corresponding memory cells which are used for making the connections between the various buses. Each transistor switch and memory cell is illustrated in the figure as a circle (or bubble) drawn at the intersection of signal lines to be coupled together. In order to illustrate this, FIG. 15 shows a detail of the circles designated by 170.

As illustrated, the third set of routing conductors interconnect areas 256, 258, 260, 262 includes transistor switches and memory cells at many intersections of signal lines, but not at all intersections. (Again, the transistor switches and memory cells are inside the illustrated circles or bubbles). When a transistor switch and memory cell is included at every intersection of signal lines, this is known as a "fully populated" routing interconnect portion. A fully populated routing interconnect portion is shown in the routing interconnect area 258. It should be well understood that the specific intersections chosen to have a transistor switch and memory cell, and which areas are fully populated (if any), may vary widely in accordance with the present invention. In other words, many different patterns of transistor switches and memory cells may be used in the routing interconnect areas 256, 258, 260, 262 in accordance with the present invention.

The number of transistor switches used and their positioning in the FPGA tile 20 can change in accordance with the present invention. The specific arrangement and positioning of IGs, FGs, routing buses, routing interconnect areas, and switching transistors within routing interconnect areas will vary greatly depending on the particular application. From this disclosure, it will be apparent to persons of ordinary skill in the art that the configurations illustrated in the figures herein are example configurations.

Figure 22:
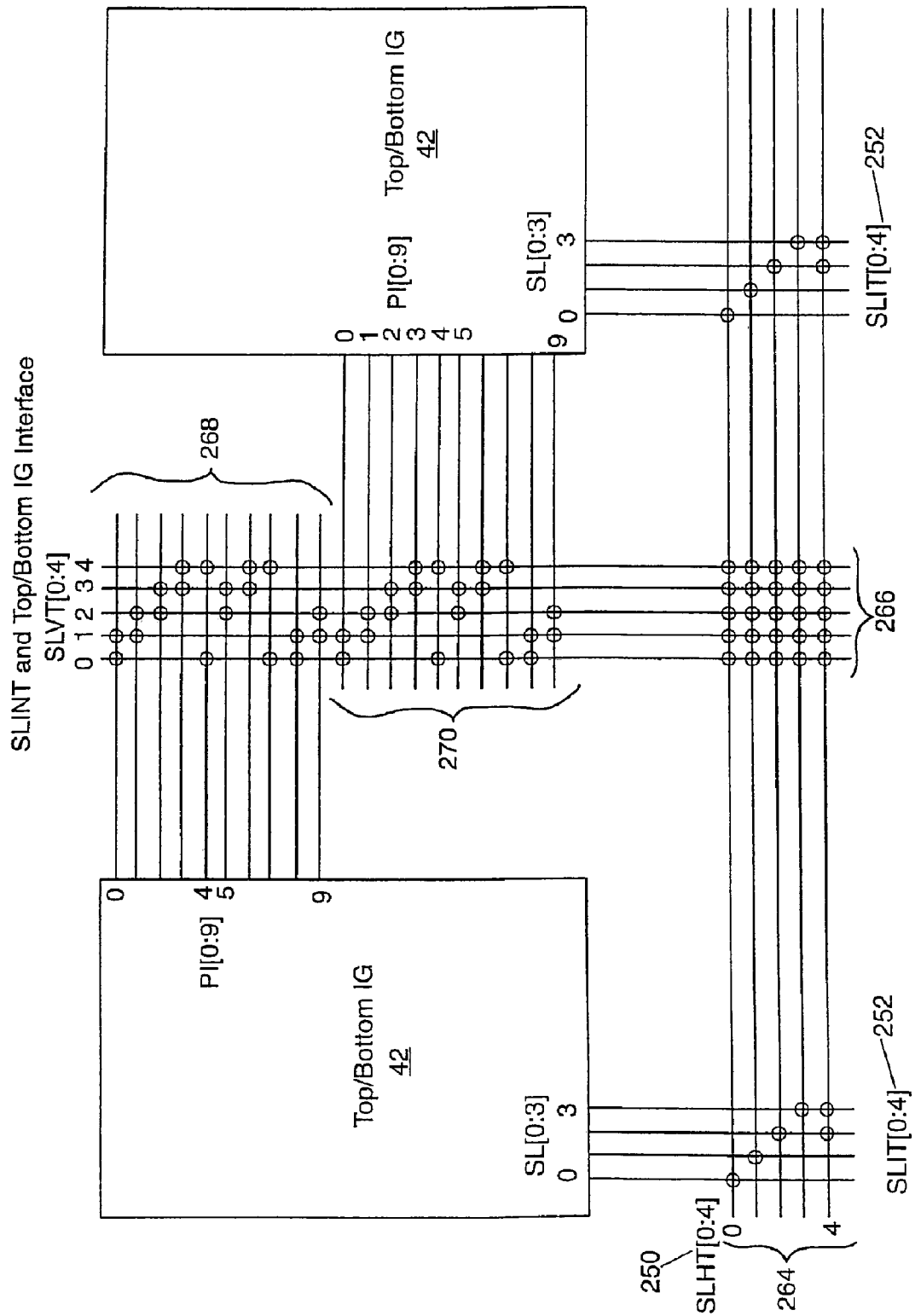
FIG. 22 is a schematic diagram illustrating in further detail a portion of the third set of routing conductors between top/bottom interface groups (IGs).
Figure 23:
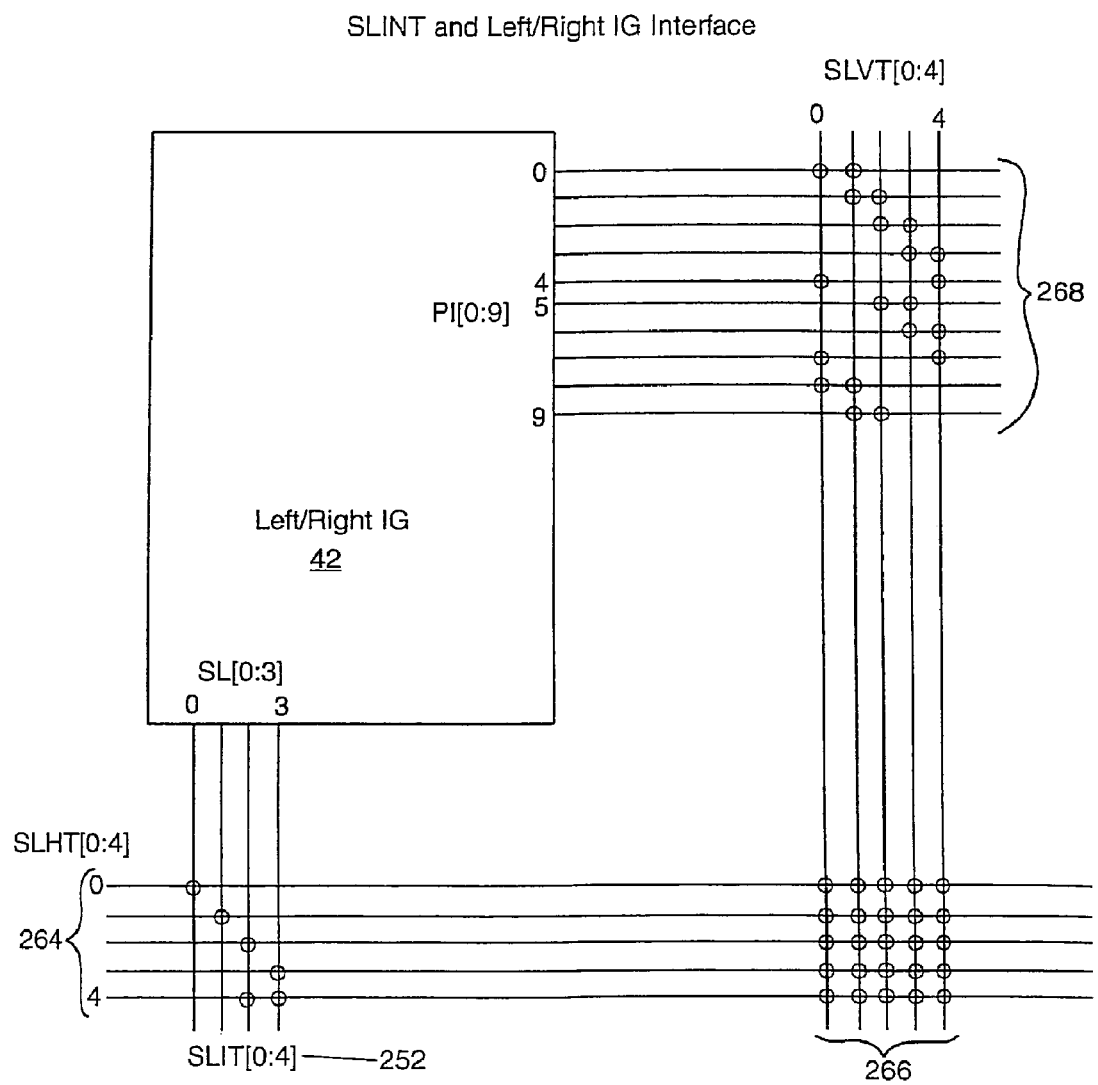
FIG. 23 is a schematic diagram illustrating in further detail a portion of the third set of routing conductors between left/right interface groups (IGs).

FIGS. 22 and 23 show the SLINT signal distribution through a flexible network as it pertains to IGs 42. FIGS. 22 and 23 illustrate an exemplary structure for the third set of routing conductors interconnect areas 264, 266, 268 and 270 between adjacent top/bottom IGs 42 and left/right IGs 42. Every output of an IG 40, PI[0:9] can be used to drive the SLINT network.

As illustrated, the routing interconnect areas 264, 266, 268, 270 includes transistor switches and memory cells at many intersections of signal lines, but not at all intersections. From this disclosure, it will be apparent to persons of ordinary skill in the art, however, that the specific number of lines in any of the routing buses may vary in accordance with the present invention. Furthermore, it should be well understood that the specific number of lines in any of the signal buses, such as for example PI[0:9], SL[0:3], may vary in accordance with the present invention.

Figure 24:
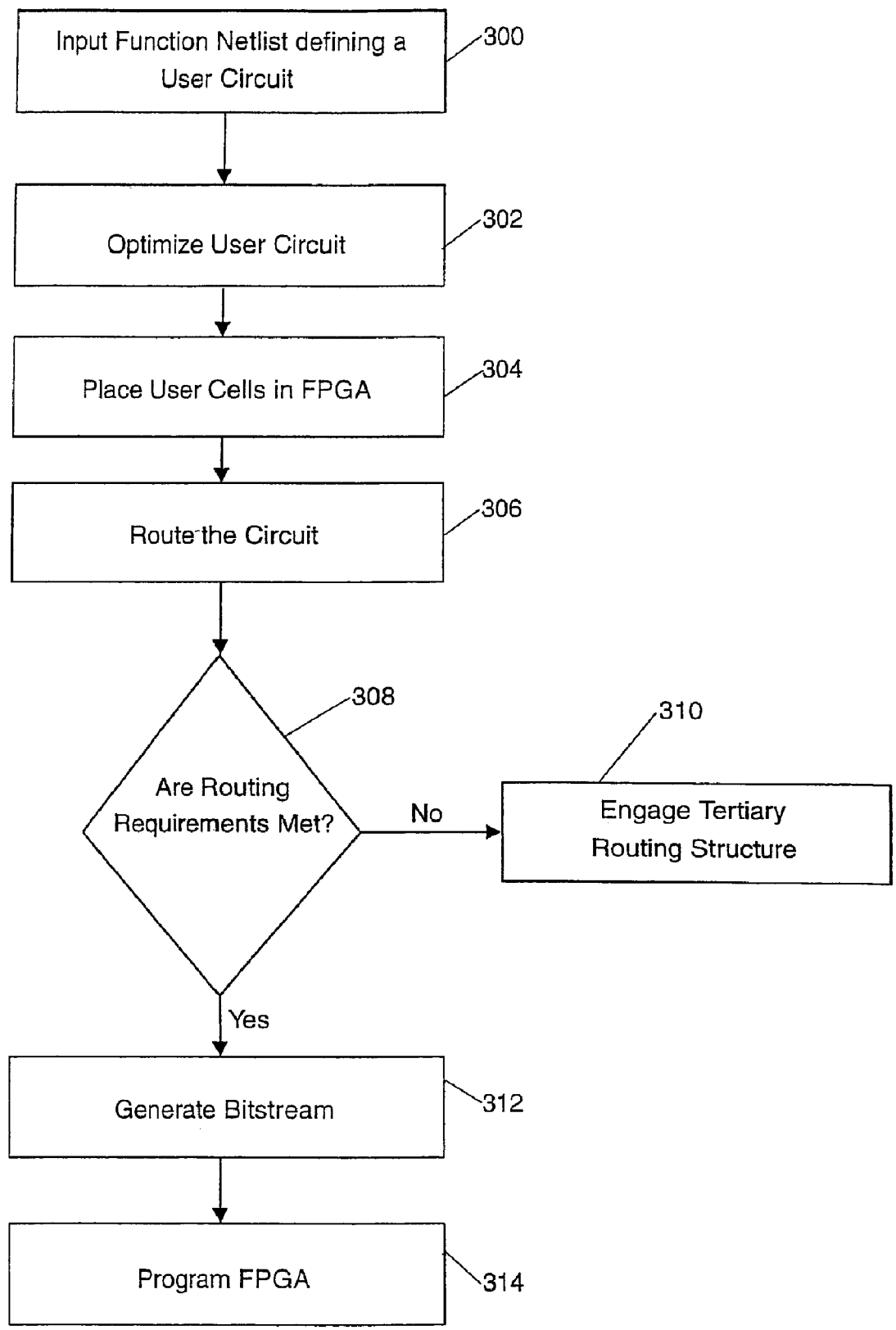
FIG. 24 is a flowchart illustrating a method of routing the FPGA tile shown in FIG. 5.

FIG. 24 discloses a method of routing a FPGA. A method of routing an FPGA in accordance with the present invention begins at input block 300. At input block 300, a user inputs a function netlist that defines a user circuit. The user circuit will define the programmable connections to be programmed to implement the desired user function. These programmable connections include programmable interconnections of the FPGA array, as well as the connections within internal components included within the FPGA.

Internal components, as used in the present invention are defined as, for example, configurable functional groups, interface groups, selection circuits, multiplexer circuits, memory cells, look up tables, PLA blocks, non-volatile blocks, DRAM blocks, ROM blocks, RAM, FIFO, PLL, DLL, FLASH memory. multipliers, DSP cores, MPU cores, DAC, ADC, and any other internal components as known by those skilled in the art. Programming the FPGA causes not only the programmable interconnections of the FPGA to be configured, but also causes the connections within the internal components included within the FPGA to be connected which ultimately results in lines being coupled together or not being coupled together, due to transistors being turned on and off.

At step 302, the user circuit is optimized. Next at step 304, the user cells defining the optimized user circuit are placed in the FPGA. At step 306, the circuit is routed. Next, at step 308, it is determined whether the routing requirements of the user circuit are met using the first set of routing conductors. If the user circuit routing requirements are not met using the first set of routing conductors, the third set of routing conductors are engaged at step 310. The third set of routing conductors are employed in addition to the first set of routing conductors and are used only when the routing requirements cannot be met with first set of routing conductors.

Whether the user circuit routing requirements are met using the first set of routing conductors or both the first and third set of routing conductors, at step 312 the bitstream is generated. Finally, at step 314, the FPGA is programmed with the user circuit.

The full disclosures of the following United States Patent Applications are hereby incorporated into the present application by reference: U.S. patent application Ser. No. 09/231,998, filed Jan. 15, 1999, now abandoned; U.S. patent application Ser. No. 09/281,008, filed Mar. 30, 1999, now issued as U.S. Pat. No. 6,301,696; U.S. patent application Ser. No. 09/285,563, filed Apr. 2, 1999, now issued as U.S. Pat. No. 6,446,242; and U.S. patent application Ser. No. 09/318,198, filed May 25, 1999, now issued as U.S. Pat. No. 6,211,697.

From this disclosure, it will be apparent to persons of ordinary skill in the art that various alternatives to the embodiments of the invention described herein may be employed in practicing the invention. It is intended that the following claims define the scope of the invention and that structures and methods within the scope of these claims and their equivalents be covered thereby.

What is claimed is:

1. A method for providing a routing structure for a field programmable gate array (FPGA) comprising:
   providing a first FPGA tile comprising:
      providing a plurality of logic components, at least one of said logic components having a first, second and third set of input ports and having a first and second set of output ports;
      providing a first set of routing conductors disposed within said first FPGA tile programmably coupled to said first set of output ports of said logic components and configured to receive signals, route signals within said first FPGA tile, and provide said signals to said first set of input ports of said logic components, said first set of routing conductors comprising a plurality of horizontal routing buses and a plurality of vertical routing buses, wherein at least one of said plurality of horizontal routing buses forms an intersection with at least one of said plurality of vertical routing buses at a routing interconnect area;
      providing a second set of routing conductors disposed across said first FPGA tile and at least one other FPGA tile, independent of said first set of routing conductors coupled to said second set of output ports and that is configured to receive, select and route signals around said first FPGA tile and within said first FPGA tile, and provide said signals to said second set of input ports of said logic components; and
      providing a third set of routing conductors disposed across said first FPGA tile, independent of said first and second set of routing conductors, coupled to at least one of said first output ports of said logic components and configured to receive signals, route signals around said first FPGA tile and within said first FPGA tile, and provide said signals to said third set of input ports of said logic components.

2. The method of claim 1, wherein said routing interconnect area comprises a programmable interconnect element at said intersection of said at least one of said plurality of horizontal routing buses and said at least one of said plurality of vertical routing buses.

3. The apparatus of claim 2, wherein said programmable interconnect element comprises a transistor switch and a corresponding memory cell.

* * * * *